United States Patent
Kim et al.

(10) Patent No.: US 8,802,495 B2
(45) Date of Patent: Aug. 12, 2014

(54) SEMICONDUCTOR PACKAGES, METHODS OF MANUFACTURING THE SAME, AND SEMICONDUCTOR PACKAGE STRUCTURES INCLUDING THE SAME

(71) Applicant: Samsung Electronics Co., Ltd., Suwon-si (KR)

(72) Inventors: Ji Hwang Kim, Bucheon-si (KR); Tae Hong Min, Yongin-si (KR); Chajea Jo, Bucheon-si (KR); Taeje Cho, Hwaseong-si (KR); Young Kun Jee, Suwon-si (KR); Yun Seok Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/955,259

(22) Filed: Jul. 31, 2013

(65) Prior Publication Data

US 2014/0038353 A1   Feb. 6, 2014

(30) Foreign Application Priority Data

Aug. 3, 2012   (KR) ........................ 10-2012-0085396

(51) Int. Cl.
*H01L 21/50* (2006.01)
*H01L 21/56* (2006.01)

(52) U.S. Cl.
CPC ................ *H01L 21/50* (2013.01); *H01L 21/56* (2013.01)
USPC ........................................ 438/107; 438/127

(58) Field of Classification Search
CPC ................................ H01L 21/50; H01L 21/56
USPC .......................................... 438/107, 127, 455
See application file for complete search history.

(56) References Cited

U.S. PATENT DOCUMENTS

| | | | |
|---|---|---|---|
| 7,960,840 B2 | 6/2011 | Bonifield et al. | |
| 8,114,707 B2 | 2/2012 | Farooq et al. | |
| 8,243,487 B2 | 8/2012 | Kang et al. | |
| 8,258,007 B2 | 9/2012 | Shen et al. | |
| 8,267,143 B2 | 9/2012 | George et al. | |
| 8,293,580 B2 | 10/2012 | Kim et al. | |
| 8,324,105 B2 | 12/2012 | Cheng | |
| 8,367,471 B2 * | 2/2013 | Pratt | 438/109 |
| 8,450,151 B1 * | 5/2013 | Poddar et al. | 438/112 |

(Continued)

FOREIGN PATENT DOCUMENTS

| | | |
|---|---|---|
| KR | 20090111380 A | 10/2009 |
| KR | 20100009849 A | 1/2010 |

(Continued)

*Primary Examiner* — Alexander Ghyka
(74) *Attorney, Agent, or Firm* — Harness, Dickey & Pierce, P.L.C.

(57) ABSTRACT

A method of manufacturing a semiconductor package includes preparing a parent substrate including package board parts laterally spaced apart from each other, mounting a first chip including a through-via electrode on each of the package board parts, forming a first mold layer on the parent substrate having the first chips, planarizing the first mold layer to expose back sides of the first chips, etching the exposed back sides of the first chips to expose back sides of the through-via electrodes, forming a passivation layer on the planarized first mold layer, the etched back sides of the first chips, and the back sides of the through-via electrodes, and selectively removing the passivation layer to expose the back sides of the through-via electrodes.

21 Claims, 25 Drawing Sheets

(56) References Cited

U.S. PATENT DOCUMENTS

| | | | |
|---|---|---|---|
| 8,531,034 B2* | 9/2013 | Byun et al. | 257/773 |
| 8,604,615 B2* | 12/2013 | Lee et al. | 257/737 |
| 2007/0178694 A1* | 8/2007 | Hiatt | 438/667 |
| 2009/0039491 A1* | 2/2009 | Kim et al. | 257/686 |
| 2009/0126974 A1 | 5/2009 | Yuasa et al. | |
| 2010/0012364 A1 | 1/2010 | Kim et al. | |
| 2010/0126765 A1 | 5/2010 | Kim et al. | |
| 2010/0279463 A1 | 11/2010 | Hsiao et al. | |
| 2011/0010908 A1 | 1/2011 | George et al. | |
| 2011/0058348 A1* | 3/2011 | Sakai et al. | 361/803 |
| 2011/0069467 A1 | 3/2011 | Flaim et al. | |
| 2011/0297329 A1 | 12/2011 | Canale et al. | |
| 2011/0304999 A1 | 12/2011 | Yu et al. | |
| 2012/0013013 A1 | 1/2012 | Sadaka et al. | |
| 2012/0018881 A1* | 1/2012 | Pagaila | 257/737 |
| 2012/0034437 A1 | 2/2012 | Puligadda et al. | |
| 2012/0187568 A1* | 7/2012 | Lin et al. | 257/774 |
| 2012/0286404 A1* | 11/2012 | Pagaila | 257/659 |
| 2013/0187288 A1* | 7/2013 | Hong et al. | 257/774 |
| 2013/0299961 A1* | 11/2013 | Chen | 257/706 |
| 2013/0299976 A1* | 11/2013 | Chen et al. | 257/737 |
| 2014/0001649 A1* | 1/2014 | Byun et al. | 257/774 |
| 2014/0017823 A1* | 1/2014 | England et al. | 438/15 |

FOREIGN PATENT DOCUMENTS

| | | |
|---|---|---|
| KR | 20100040196 A | 4/2010 |
| KR | 20100041980 A | 4/2010 |
| KR | 20100136866 A | 12/2010 |

\* cited by examiner

SEMICONDUCTOR PACKAGES, METHODS OF MANUFACTURING THE SAME, AND SEMICONDUCTOR PACKAGE STRUCTURES INCLUDING THE SAME

CROSS-REFERENCE TO RELATED APPLICATIONS

This U.S. non-provisional patent application claims priority under 35 U.S.C. §119 to Korean Patent Application No. 10-2012-0085396, filed on Aug. 3, 2012, the entirety of which is incorporated by reference herein.

BACKGROUND

The inventive concepts relate to a semiconductor and, more particularly, to semiconductor packages, methods of manufacturing the same and semiconductor package structures including the same.

Semiconductor chips are widely used in the electronics industry because of their smaller size, multi-functional capability, and/or lower manufacture costs per unit. The semiconductor chips may be formed into semiconductor packages by various packaging techniques. The semiconductor packages including the semiconductor chips may be installed in various electronic products.

Sizes of the semiconductor chips and/or the semiconductor packages have been reduced. Thus, various problems may be caused. For example, it may be difficult to handle the semiconductor chips and/or semiconductor packages. As a result, manufacturing yield of the semiconductor packages may be reduced and a manufacturing time of the semiconductor packages may increase, thereby reducing productivity of the semiconductor packages and deteriorating reliability of the semiconductor packages.

SUMMARY

Example embodiments may provide semiconductor packages capable of improving productivity, methods of manufacturing the same, and semiconductor package structures including the same.

Example embodiments may also provide semiconductor packages capable of improving reliability, methods of manufacturing the same, and semiconductor package structures including the same.

According to an example embodiment, a method of manufacturing a semiconductor package includes preparing a parent substrate including a plurality of package board parts laterally spaced apart from each other, mounting first chips on the package board parts such that each of the first chips is mounted on a different one of the package board parts, each of the first chips including at least one through-via electrode, back sides of the first chips covering the through-via electrodes, forming a first mold layer on the parent substrate having the first chips, planarizing the first mold layer to expose the back sides of the first chips, etching the exposed back sides of the first chips to thin the first chips and to expose back sides of the through-via electrodes, forming a passivation layer on the planarized first mold layer, the etched back sides of the first chips, and the back sides of the through-via electrodes, and selectively removing the passivation layer disposed on the back sides of the through-via electrodes to expose the back sides of the through-via electrodes.

The passivation layer may include a polymer insulating layer.

The passivation layer may include a first sub-passivation layer and a second sub-passivation layer which are sequentially stacked. The first sub-passivation layer may include at least one chemical vapor deposition (CVD) insulating layer, and the second sub-passivation layer may include the polymer insulating layer.

The method may further include mounting second chips on the passivation layer disposed on the etched back side of each of the thinned first chips, and forming a second mold layer on the parent substrate including the first and second chips. Each of the second chips may be electrically connected to the back side of the through-via electrode of a corresponding one of the thinned first chips.

The method may further include forming inter-chip pads on the exposed back sides of the through-via electrodes after selectively removing the passivation layer and before mounting the second chips. The second chips may be electrically connected to the through-via electrodes through the inter-chip pads.

A portion of the passivation layer may remain on the planarized first mold layer after selectively removing the passivation layer disposed on the back sides of the through-via electrodes, and the second mold layer may be formed on the remaining passivation layer.

The method may further include removing the passivation layer disposed on the planarized first mold layer. The passivation layer on the etched back sides of the first chips may remain after the removing the passivation layer disposed on the planarized first mold layer.

The method may further include planarizing the second mold layer to expose the second chips, mounting third chips on the second chips, and forming a third mold layer on the parent substrate including the third chips.

The method may further include mounting a third chip on each of the second chips before forming the second mold layer. The second mold layer may cover the second and third chips and the planarized first mold layer.

The method may further include bonding the parent substrate to a carrier substrate before mounting the first chip on the package board parts.

The exposed back sides of the first chips may be etched so that the through-via electrodes may protrude from the etched back sides of the thinned first chips.

A first chip may include a chip bump electrically connected to a through-via electrode. The package board part may include at least one internal connection pad and at least one external connection pad. In this case, mounting the first chip on each of the package board parts may include loading the first chip on each of the package board parts to connect the chip bump to the internal connection pad of the package board part, and filling a space between the first chip and the package board part with an underfiller.

The method may further include cutting at least the parent substrate and the planarized first mold layer along a scribe region of the parent substrate between the package board parts to form semiconductor packages separated from each other.

According to an example embodiment, a method of manufacturing a semiconductor package includes preparing a parent substrate including a plurality of package board parts laterally spaced apart from each other, mounting first chips on the package board parts, forming a first mold layer on the parent substrate having the first chips, planarizing the first mold layer to expose the first chips; forming via-holes in the exposed first chips, forming at least one through-via electrodes in the via-holes, mounting second chips on the first chips having the through-via electrodes, and forming a second mold layer on the parent substrate including the first chips and the second chips.

The method may further include forming a passivation layer on the exposed first chips and the planarized first mold layer before forming the via-holes. For example, the forming via-holes may successively penetrate the passivation layer and the first chips.

The passivation layer may include a first sub-passivation layer and a second sub-passivation layer which are sequentially stacked. The first sub-passivation layer may include at least one CVD insulating layer and the second sub-passivation layer may include a polymer insulating layer.

The method may further include bonding the parent substrate to a carrier substrate before mounting the first chip on each of the package board parts.

According to an example embodiment, a semiconductor package may include a first chip mounted on a package board, the first chip including a first surface being adjacent to the package board, a second surface being opposite to the first surface, and at least one through-via electrode, a first mold layer surrounding a sidewall of the first chip, the first mold layer having a planarized top surface, a second chip mounted on the second surface of the first chip, a second mold layer disposed on the first mold layer and surrounding at least a sidewall of the second chip, and a passivation layer disposed at least between the planarized top surface of the first mold layer and the second mold layer.

The passivation layer may be further disposed between the second surface of the first chip and the second chip.

The passivation layer may include a polymer insulating layer.

The passivation layer may include a first sub-passivation layer and a second sub-passivation layer which are sequentially stacked. The first sub-passivation layer may include at least one CVD insulating layer and the second sub-passivation layer may include the polymer insulating layer.

The first mold layer may is structured such that the second surface of the first chip is exposed.

In an embodiment, the semiconductor package may further include a chip-bump attached to the first chip, and the chip bump is disposed between the first chip and the package board; and the chip bump may be electrically connected to an end of the through-via electrode. In this case, the semiconductor package may further include an underfiller filling a space between the first chip and the package board and surrounding the chip bump.

The semiconductor package may further include a third chip mounted on a top surface of the second chip, and a third mold layer disposed on the second mold layer and surrounding at least a sidewall of the third chip. The second mold layer may have a planarized top surface and the second mold layer may be structured such that the top surface of the second chip is exposed.

The semiconductor package may further include a second passivation layer disposed between the planarized top surface of the second mold layer and the third mold layer.

The semiconductor package may further include a third chip mounted on a top surface of the second chip. The second mold layer may cover the sidewall of the second chip and at least a sidewall of the third chip.

According to an example embodiment, a semiconductor package structure may include a carrier substrate, a parent substrate bonded to the carrier substrate, the parent substrate including a plurality of package board parts laterally spaced apart from each other, first chips mounted on the package board parts, each of the first chips including a first surface adjacent to the package board part, a second surface opposite to the first surface, and at least one through-via electrode, a first mold layer disposed on the parent substrate and surrounding sidewalls of the first chips, second chips mounted on the second surfaces of the first chips;, a second mold layer disposed on the first mold layer and surrounding at least sidewalls of the second chips; and a passivation layer disposed at least between the first chips and the second chips.

A method of manufacturing a semiconductor package includes providing first chips on a parent substrate, the first chips electrically coupled to the parent substrate, and each of the first chips including at least one first through-via electrode, a first end of each first through-via electrode electrically coupled to the parent substrate and a second end of each first through-via electrode inside a respective one of the first chips, providing a first mold layer on the first chips, planarizing the first mold layer to expose top surfaces of the first chips, thinning the first chips by etching the exposed top surfaces of the first chips such that the second ends of the first through-via electrodes are exposed, selectively providing a passivation layer on the etched top surfaces of the first chips such that the second end of the first through-via electrodes are exposed, providing second chips on the first chips, each of the second chips electrically coupled to a corresponding one of the first chips, providing a second mold layer on the second chips, and singulating the resultant structure to form the semiconductor package The selectively providing a passivation layer may expose top surfaces of the planarized first mold layer.

The method of manufacturing a semiconductor package may further includes providing a connection medium on the exposed second ends of the first through-via electrodes after the selectively providing the passivation layer and before the providing the second chips on each of the first chips.

The connection medium may include at least one of an inter-chip pad and a chip bump.

Each of the second chips may include at least one second through-via electrode, the second through-via electrodes electrically coupled to corresponding at least one first through-via electrodes.

The providing a second mold layer on the second chips may provide the second mold layer on side surfaces of the second chips, while exposing top surfaces of the second chips.

The method of manufacturing a semiconductor package may further include attaching a carrier substrate to the parent substrate.

BRIEF DESCRIPTION OF THE DRAWINGS

Example embodiments will become apparent and easily appreciated in view of the attached drawings and accompanying detailed description. FIGS. 1-40 represent non-limiting, example embodiments as described herein.

FIGS. 1 to 9 are cross-sectional views illustrating a method of manufacturing a semiconductor package according to an example embodiment;

FIG. 10 is a perspective view illustrating an example of a parent substrate in FIG. 1;

FIGS. 12 and 13 are cross-sectional views illustrating a modified method of manufacturing a semiconductor package according to an example embodiment;

FIGS. 14 and 15 are cross-sectional views illustrating a modified method of manufacturing a semiconductor package according to another example embodiment;

FIGS. 16 and 17 are cross-sectional views illustrating a modified method of manufacturing a semiconductor package according to still another example embodiment;

FIG. 18 is a cross-sectional view illustrating a semiconductor package according to an example embodiments;

FIG. 19 is a cross-sectional view illustrating a modified semiconductor package according to an example embodiment;

FIG. 20 is a cross-sectional view illustrating a modified semiconductor package according to another example embodiment;

FIG. 21 is a cross-sectional view illustrating a modified semiconductor package according to still another example embodiment;

FIGS. 22 to 26 are cross-sectional views illustrating a method of manufacturing a semiconductor package according to another example embodiment;

FIG. 27 is a perspective view illustrating a structure shown in FIG. 25;

FIGS. 28 and 29 are cross-sectional views illustrating a modified method of manufacturing a semiconductor package according to an example embodiment;

FIG. 30 is cross-sectional view illustrating a modified method of manufacturing a semiconductor package according to another example embodiment;

FIG. 31 is cross-sectional view illustrating a modified method of manufacturing a semiconductor package according to still another example embodiment;

FIGS. 32 and 33 are cross-sectional views illustrating a modified method of manufacturing a semiconductor package according to yet another example embodiment;

FIGS. 34, 35, 36, 37 and 38 are cross-sectional views illustrating a modified method of manufacturing a semiconductor package according to a further example embodiment;

FIG. 39 is a schematic block diagram illustrating an electronic systems including semiconductor packages according to example embodiments; and FIG. 40 is a schematic block diagram illustrating a memory card including semiconductor packages according to example embodiments.

DETAILED DESCRIPTION OF THE EMBODIMENTS

Figure 1:
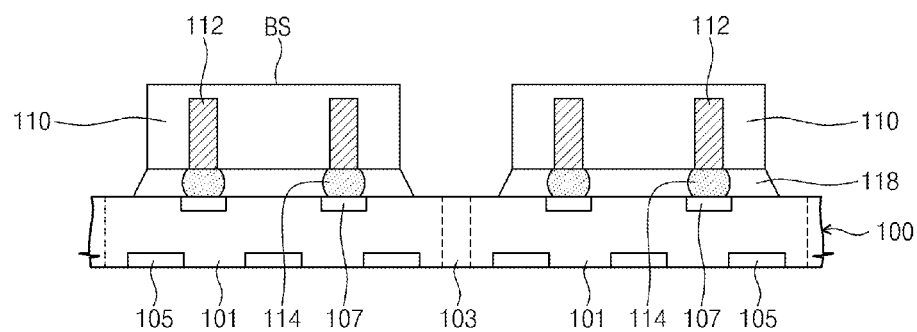

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Example embodiments explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIGS. 1 to 9 are cross-sectional views illustrating a method of manufacturing a semiconductor package according to an example embodiment. FIG. 10 is a perspective view illustrating an example of a parent substrate in FIG. 1.

Referring to FIG. 1, a parent substrate 100 may be prepared. The parent substrate 100 includes a plurality of package board parts 101 laterally spaced apart from each other. Additionally, the parent substrate 100 may further include a scribe region 103 disposed between the package board parts 101. The package board parts 101 may be isolated from each other by the scribe region 103. For example, each of the package board parts 101 may be a printed circuit board. Thus, the parent substrate 100 may include a plurality of printed circuit boards connected to each other through the scribe region 103.

Each of the package board parts 101 may include at least one external connection pad 105 and at least one internal connection pad 107. The external connection pad 105 may be disposed on a bottom surface of the package board part 101, and the internal connection pad 107 may be disposed on a top surface of the package board part 101. Internal interconnections may be disposed within the package board part 101. The internal connection pad 107 may be electrically connected to the external connection pad 105 through the internal interconnections.

For example, the parent substrate 100 may have a circular plate as illustrated in FIG. 10. For example, the parent substrate 100 may have the same shape as a wafer on which chips are formed. However, the inventive concepts are not limited thereto. The parent substrate 100 may have various shapes.

Referring to FIG. 1, a first chip 110 may be mounted on each of the package board part 101. The first chip 110 may have a first surface adjacent to the package board part 101 and a second surface BS opposite to the first surface. The first chip 110 may include at least one through-via electrode 112. The through-via electrode 112 may extend from the first surface toward the second surface BS through the inside of the first chip 110. A thickness of the first chip 110 may be greater than a height of the through-via electrode 112. Thus, the through-via electrode 112 may partially penetrate the first chip 110, and the through-via electrode 112 may be covered by the second surface BS and may not be exposed. Because the first chip 110 may have the thickness greater than the height of the through-via electrode 11, the first chip 110 may be sufficiently thick. Thus, the first chip 110 may be easily handled.

The first chip 110 may further include a first chip bump 114. The first chip bump 114 may be disposed on the first surface of the first chip 110 and be electrically connected to an end of the through-via electrode 112. The first chip 110 may be a semiconductor chip, e.g., a semiconductor memory device, a logic device, or a system on chip performing various functions. Alternatively, the first chip 110 may be an interposer.

The first chip 110 may have various structures according to a shape of the through-via electrode 112. This will be described with reference to FIGS. 11A, 11B, and 11C.

Figure 11A:
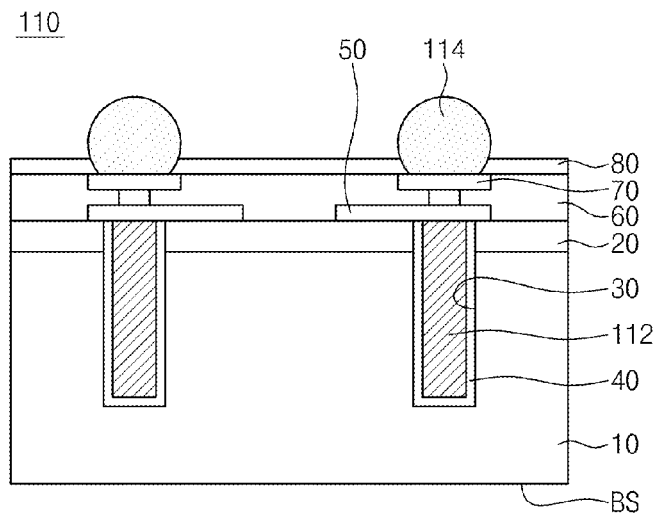
FIG. 11A is a cross-sectional view illustrating an example of a first chip in FIG. 1.

FIG. 11A is a cross-sectional view illustrating an example of a first chip in FIG. 1.

Referring to FIG. 11A, a first chip 110 according to an example embodiment may include a semiconductor substrate 10. The semiconductor substrate 10 may have a front side and a back side opposite to each other. The back side of the semiconductor substrate 10 may be the second surface BS of the first chip 110. An integrated circuit may be disposed on the front side of the semiconductor substrate 10. A first interlayer insulating layer 20 may be disposed on the front surface of the semiconductor substrate 10 to cover the integrated circuit. The integrated circuit may include memory cells and/or a logic circuit. The first interlayer insulating layer 20 may be single-layered or multi-layered.

A through-via electrode 112 according to an example embodiment may have a via-middle structure. The through-via electrode 112 is formed after the integrated circuit and the first interlayer 20 are formed and before a metal interconnection 50 is formed. For example, the through-via electrode 112 may be disposed in a via-hole 30 extending from a top surface of the first interlayer insulating layer 20 into the semiconductor substrate 10. A via-insulating layer 40 may be disposed between an inner surface of the via-hole 30 and the through-via electrode 112. In this case, a bottom surface of the via-hole 30 may be spaced apart from the second surface BS of the first chip 110. For example, the bottom surface of the via-hole 30 may be disposed at a level higher than the second surface BS of the first chip 110, as illustrated in FIG. 11A.

The metal interconnection 50 may be disposed on the first interlayer insulating layer 60 and electrically connect the through-via electrode 112 to the integrated circuit. The metal interconnection 50 may be a single layer or a multi-layer. A second interlayer insulating layer 60 may cover the metal interconnection 50. The second interlayer insulating layer 60 may be single-layered or multi-layered. A chip pad 70 may be disposed on the second interlayer insulating layer 60. The chip pad 70 may be electrically connected to the metal interconnection 50. A chip-protecting layer 80 may be disposed on the second interlayer insulating layer 60. The chip-protecting layer 80 may have an opening exposing the chip pad 70. The first chip bump 114 may be connected to the chip pad 70 through the opening of the chip-protecting layer 80. For example, the first chip bump 114 may be a solder ball. However, the inventive concepts are not limited thereto.

Figure 11B:
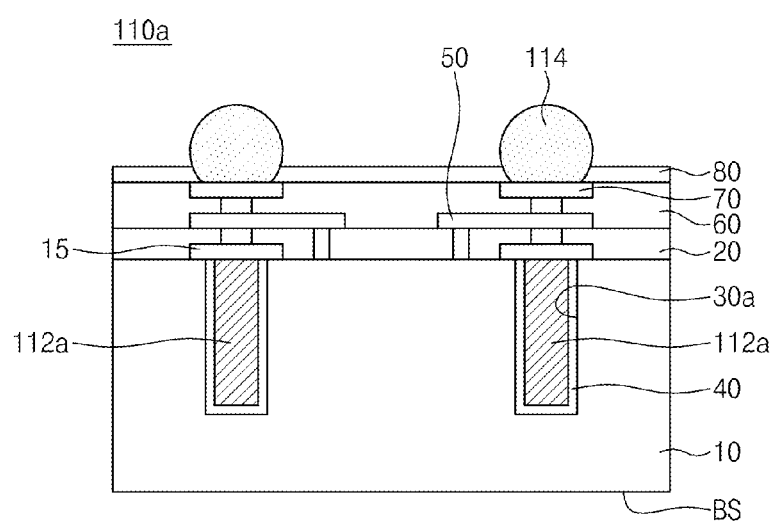
FIG. 11B is a cross-sectional view illustrating another example of a first chip in FIG. 1.

FIG. 11B is a cross-sectional view illustrating another example of a first chip in FIG. 1.

Referring to FIG. 11B, a first chip 110a according to an example embodiment may include a through-via electrode 112a having a via-first structure. The through-via electrode 112a may be disposed in a via-hole 30a formed in the semiconductor substrate 10. The via-insulating layer 40 may be disposed between an inner surface of the via-hole 30a and the through-via electrode 112a. The first interlayer insulating layer 20 may cover the through-via electrode 112a. A lower interconnection 15 may be disposed between the through-via electrode 112a and the first interlayer insulating layer 20. The metal interconnection 50 may electrically connect the through-via electrode 112a to the integrated circuit covered by the first interlayer insulating layer 20 through the lower interconnection 15.

Figure 11C:
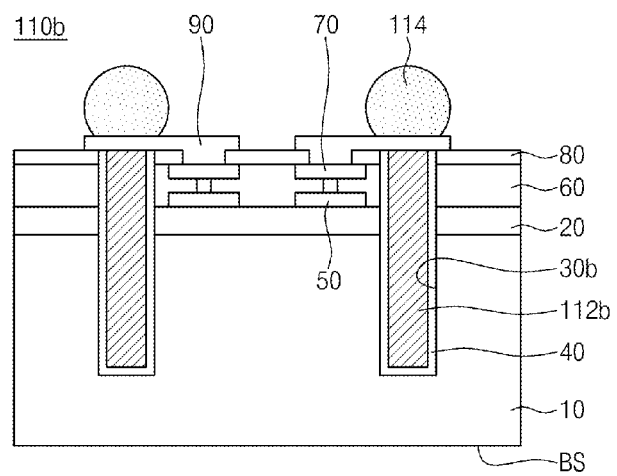
FIG. 11C is a cross-sectional view illustrating still another example of a first chip in FIG. 1.

FIG. 11C is a cross-sectional view illustrating still another example of a first chip in FIG. 1.

Referring to FIG. 11C, a first chip 110b according to an example embodiment may include a through-via electrode 112b having a via-last structure. The through-via electrode 112b may be disposed in a via-hole 30b, which is formed in at least the second and first interlayer insulating layers 60 and 20 and the semiconductor substrate 10. The via-insulating layer 40 may be disposed between an inner surface of the via-hole 30b and the through-via electrode 112b. As illustrated in FIG. 11C, the through-via electrode 112b and the via-hole 30b may extend upward to penetrate the chip-protecting layer 80. An interconnecting pad 90 may electrically connect the through-via electrode 112b to the chip pad 70. The first chip bump 114 may be formed on the interconnecting pad 90.

One of the first chips 110, 110a, and 110b of FIGS. 11A to 11C may be mounted on each of the package board parts 101 of FIG. 1. Hereinafter, the first chip 110 of FIG. 11A mounted on the package board part 101 will be used as an example for convenience of explanation.

Referring to FIG. 1 again, the first chip 110 may be mounted on the package board part 101 by a flip-chip bonding method. Thus, the first chip bump 114 of the first chip 110 may be connected to the internal connection pad 107 of the package board part 101. For example, the first chip 110 may be electrically connected to the package board part 101 through the first chip bump 114. For example, mounting the first chip 110 on the package board part 101 may include loading the first chip 110 on the package board part 101 such that the first chip bump 114 is connected to the internal connection pad 107, and filling a space between the first chip and the package board part 101 with a first underfiller 118. The first underfiller 118 may include at least one of epoxy molding compounds (EMCs).

Figure 2:
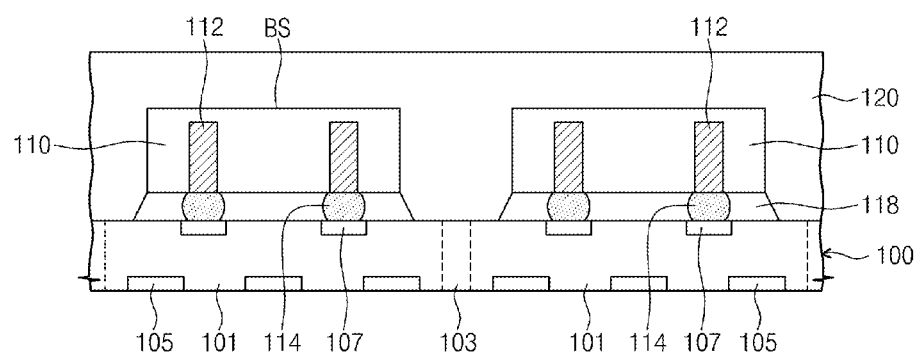

Referring to FIG. 2, a first mold layer 120 may be formed on the parent substrate 100 including the mounted first chips 110. The first mold layer 120 may cover sidewalls and the second surfaces BS of the first chips 110. The first mold layer 120 may include at least one of epoxy molding compounds. For example, the first mold layer 120 may include the same epoxy molding compound as the first underfiller 118. Alternatively, the first mold layer 120 may include an epoxy molding compound different from that of the first underfiller 118.

Figure 3:
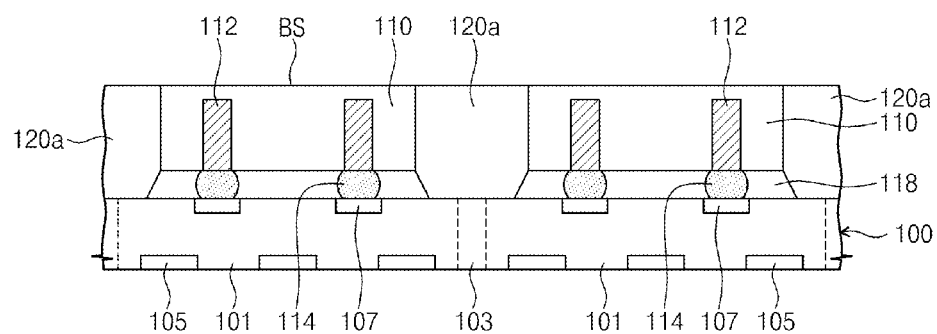

Referring to FIG. 3, the first mold layer 120 may be planarized to expose the first chips 110. At this time, the second surfaces BS of the first chips 110 may be exposed. The first mold layer 120 may be planarized by, e.g., a grinding process, an etch-back process, or a chemical mechanical polishing (CMP) process. The planarized first mold layer 120a may have a top surface substantially coplanar with the exposed second surfaces BS of the first chips 110.

Figure 4:
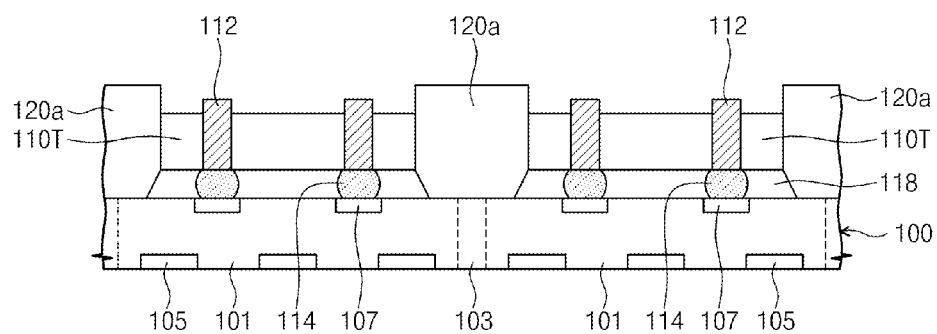

Referring to FIG. 4, the exposed second surfaces BS of the first chips 110 are etched to thin the first chips 110. At this time, the through-via electrodes 112 are exposed. The through-via electrode 112 may have a first surface electrically connected to the first chip bump 114 and a second surface opposite to the first surface. The first surface and the second surface of the through-via electrode 112 may correspond to a front surface and a back surface of the through-via electrode 112, respectively. After the first chips are thinned, the second surfaces of the through-via electrodes 112 may be exposed. For example, the etched surface of the thinned first chip 110T may be lower than the second surface of the through-via electrode 112. Thus, a portion of the through-via electrode 112 may protrude from the etched surface of the thinned first chip 110T. Because the planarized first mold layer 120 is formed of a different material from the first chip 110, the etched surface of the thinned first chip 110T may be lower than a top surface of the planarized first mold layer 120a.

The exposed second surfaces BS of the first chips 110 may be etched by a dry etching process. Alternatively, the exposed second surface BS of the first chips 110 may be etched by a wet etching process using an etchant. For example, if the exposed second surfaces BS of the first chips 110 are formed of silicon, the etchant of the wet etching process may include tetramethyl ammonium hydroxide (TMAH). However, the inventive concepts are not limited thereto.

Figure 5:
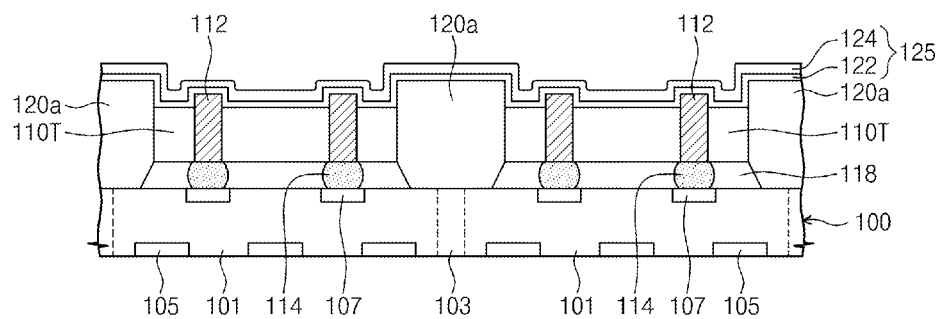

Referring to FIG. 5, a passivation layer 125 may be formed on the entire surface of the parent substrate 100. The passivation layer 125 may include a polymer insulating layer. For example, the passivation layer 125 may include a first sub-passivation layer 122 and a second sub-passivation layer 124, which are sequentially stacked. The first sub-passivation layer 122 may include a chemical vapor deposition (CVD) insulating layer formed by a CVD process. Particularly, the first sub-passivation layer 122 may include a plasma enhanced-CVD (PE-CVD) insulating layer. For example, the first sub-passivation layer 122 may include a PE-CVD oxide layer, a PE-CVD nitride layer, and/or a PE-CVD oxynitride layer. The second sub-passivation layer 124 may include the polymer insulating layer. For example, the second sub-passivation layer 124 may include a polyimide layer. The second sub-passivation layer 124 may be formed by a coating process or a tape lamination process.

Due to the coating process or the tape lamination process, the second sub-passivation layer 124 disposed on the etched surface of the thinned first chip 110T may be thicker than the second sub-passivation layer 124 disposed on the second surface of the through-via electrode 112. Additionally, because a planar area of the top surface of the planarized first mold layer 120a is wider than a planar area of the second surface of the through-via electrode 112, the second sub-passivation layer 124 disposed on the top surface of the planarized first mold layer 120a may be thicker than the second sub-passivation layer 124 disposed on the second surface of the through-via electrode 112.

The first sub-passivation layer 122 may protect the thinned first chip 110T from being contaminated by the second sub-passivation layer 124, which includes the polymer insulating layer. The first sub-passivation layer 122 may be omitted.

The thinned first chips 110T may be protected by the passivation layer 125. Thus, reliability of the semiconductor package may be improved.

Figure 6:
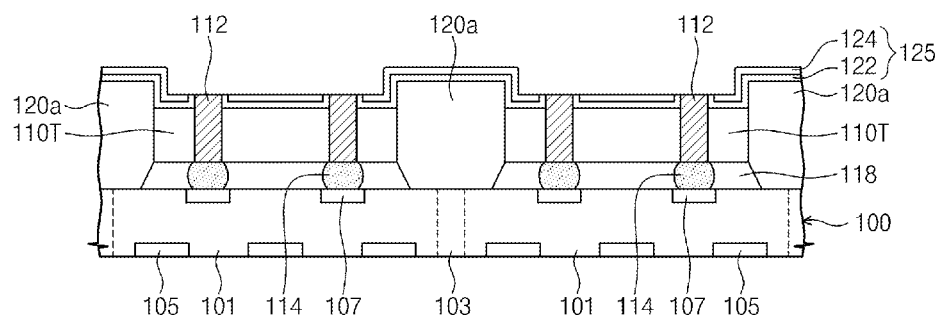

Referring to FIG. 6, the passivation layer 125 on the second surface of the through-via electrode 112 may be removed to expose the second surface of the through-via electrode 112. At this time, a portion of the passivation layer 125 may remain on the etched surface of the thinned first chip 110T. Further, a portion of the passivation layer 125 may also remain on the top surface of the planarized first mold layer 120a after the passivation layer 125 on the second surface of the through-via electrode 112 is removed, as illustrated in FIG. 6A.

For example, the passivation layer 125 on the through-via electrode 112 may be removed by an etch-back process. For example, the second sub-passivation layer 124 on the second surface of the through-via electrode 112 may be thinner than the second sub-passivation layer 124 disposed on the etched surface of the thinned first chip 110T and the top surface of the planarized first mold layer 120a. Thus, after a first etch-back process is performed on the second sub-passivation layer 124 to remove the second sub-passivation layer 124 on the second surface of the through-via electrode 112, a portion of the second sub-passivation layer 124 may remain on the thinned first chip 110T and the planarized first mold layer 120a. As a result, the first sub-passivation layer 122 on the through-via electrode 112 may be exposed, but the first sub-passivation layer 122 on the thinned first chip 110T and the planarized first mold layer 120a may be covered by the remaining second sub-passivation 124. Subsequently, a second etch-back process may be performed to remove the exposed first sub-passivation layer 122 on the through-via electrode 112. Thus, the second surface of the through-via electrode 112 may be exposed. At this time, the etched surface of the thinned first chip 110T and the top surface of the planarized first mold layer 120a may be covered by the first sub-passivation layer 122 and the remaining second sub-passivation layer 124.

Alternatively, the passivation layer 125 on the through-via electrode 112 may be removed by a selective etching process. For example, a mask layer may be formed on the parent substrate 100, and then the mask layer may be patterned to form openings exposing the passivation layer 125 on the through-via electrodes 112. Subsequently, the exposed passivation layer 125 may be etched using the mask layer having the openings as an etch mask, thereby exposing the second surfaces of the through-via electrodes 112. Thereafter, the mask layer may be removed.

Figure 7:
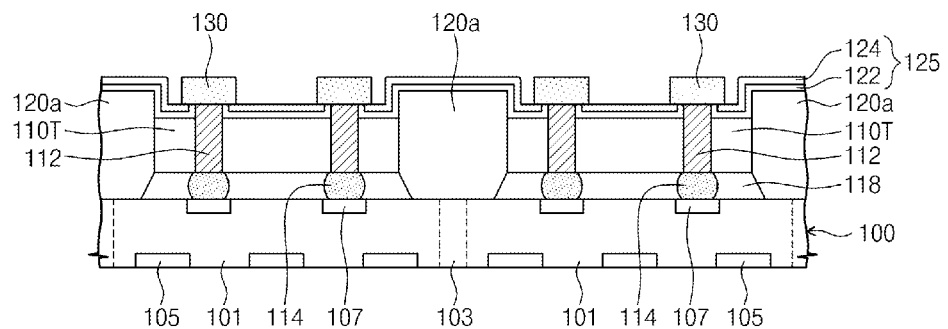

Referring to FIG. 7, an inter-chip pad 130 may be formed on each of the exposed through-via electrodes 112. The inter-chips pads 130 respectively connected to the through-via electrodes 112 may be spaced apart from each other. The inter-chip pad 130 may include a metal. For example, the inter-chip pad 130 may include copper or solder. The inter-chip pad 130 may be formed by various processes, e.g., a plating process, an inkjet process, and/or a patterning process.

Due to the passivation layer 125, electrical insulating properties between the inter-chip pad 130 and the etched surface of the thinned first chip 110T may be improved. As a result, the reliability of the semiconductor package may be improved.

Figure 8:
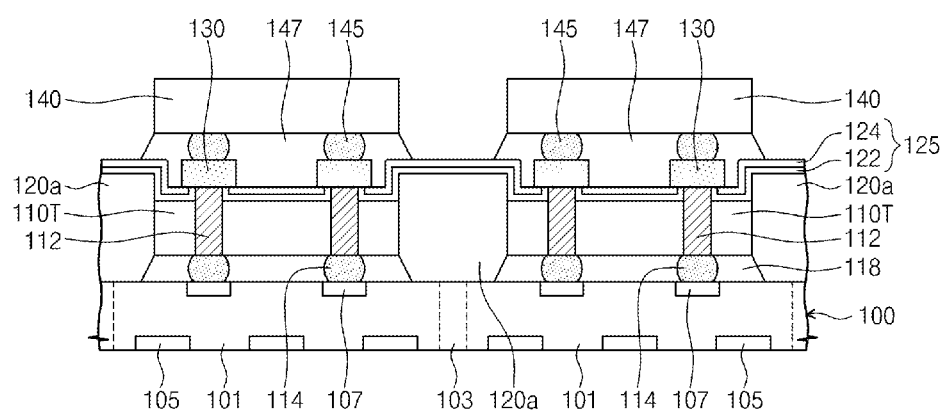

Referring to FIG. 8, a second chip 140 may be mounted on each of the thinned first chips 110T. The second chip 140 may include at least one second chip bump 145. For example, the second chip 140 may be loaded on the thinned first chip 110T to connect the second chip bump 145 to the inter-chip pad 130, and then a space between the thinned first chip 110T and the second chip 140 may be filled with a second underfiller 147. Thus, the second chip 140 may be mounted on the thinned first chip 110T. The second chip 140 may be mounted on the thinned first chip 110T by a flip chip bonding method.

The second chip 140 may be a semiconductor chip, e.g., a semiconductor memory device, a logic device, or a system on chip. Alternatively, the second chip 140 may be an interposer. A kind of the second chip 140 may be the same as or different from the kind of the thinned first chip 110T. The second chip bump 145 may be a solder ball. The second underfiller 147 may include at least one of epoxy molding compounds.

Figure 9:
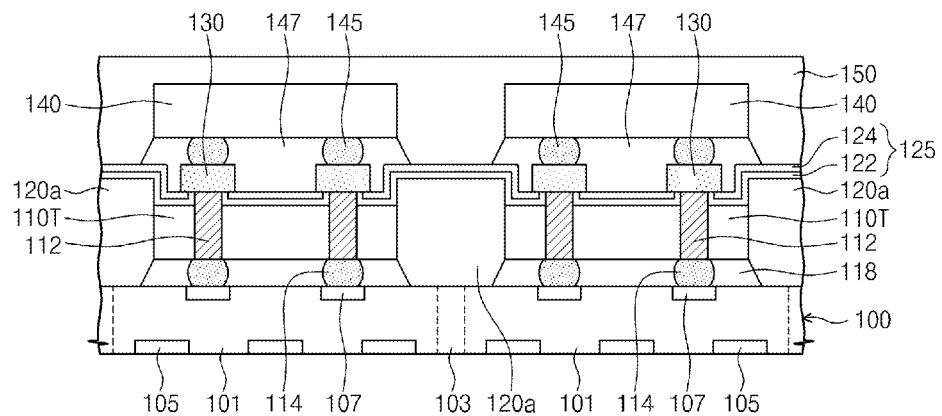
Figure 10:
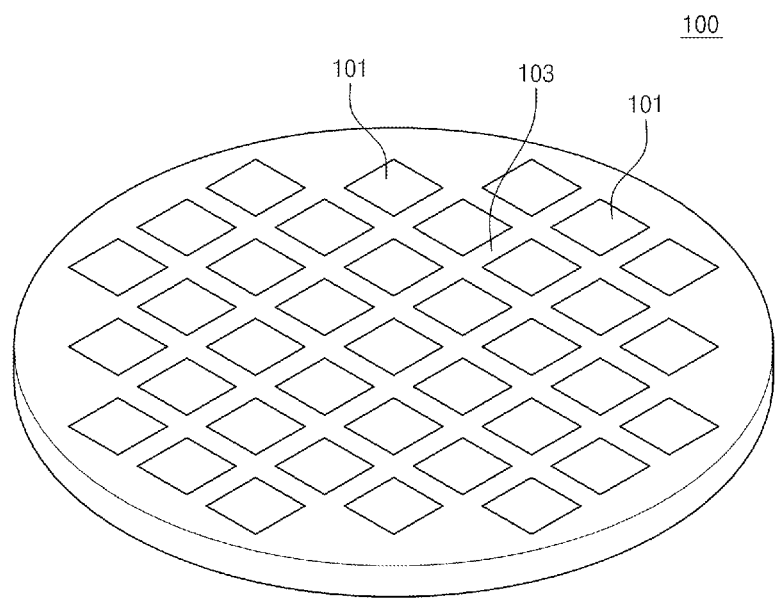

Referring to FIG. 9, a second mold layer 150 may be formed on an entire surface of the parent substrate 100 including the second chips 140. The second mold layer 150 may cover sidewalls and top surfaces of the second chips 140. For example, the passivation layer 125 may be disposed between the planarized first mold layer 120a and the second mold layer 150, as illustrated in FIG. 9.

Next, a singulation process may be performed on the parent substrate 100 including the thinned first chip 110T and the second chip 140. Thus, the parent substrate 100 may be divided into a plurality of semiconductor packages. The second mold layer 150, the passivation layer 125, the planarized first mold layer 120a, and the parent substrate 100 may be cut along the scribe region 103 of the parent substrate 100 by the singulation process. After the singulation process, an external bump EXT may be bonded to the external connection pad 105 of the package board 101 in each of the semiconductor packages. Thus, a semiconductor package 200 illustrated in FIG. 18 may be realized.

According to the method of manufacturing a semiconductor package described above, after the first chip 110 is mounted on the parent substrate 100, the first chip 110 is thinned by the etching process. In other words, a thick (e.g., unthinned) first chip 110 is mounted on the parent substrate 100. Thus, the first chip 110 mounted on the parent substrate 100 may be handled with relative ease even when the first chip 10 is subsequently thinned. Additionally, because the first and second chips 110 and 140 are stacked on the parent substrate 100 including the package board parts 101, the degree of freedom of chip design (or a chip size) of a system or a package including the first and second chips 110 and 140 may be increased. As a result, manufacturing yield of the semiconductor packages may increase and/or manufacturing time of the semiconductor packages may be reduced. Thus, productivity of the semiconductor packages may be improved and the reliability of the semiconductor packages may be improved.

Next, various modified examples of the above embodiment will be described herein below with reference to the accompanying drawings.

Figure 12:
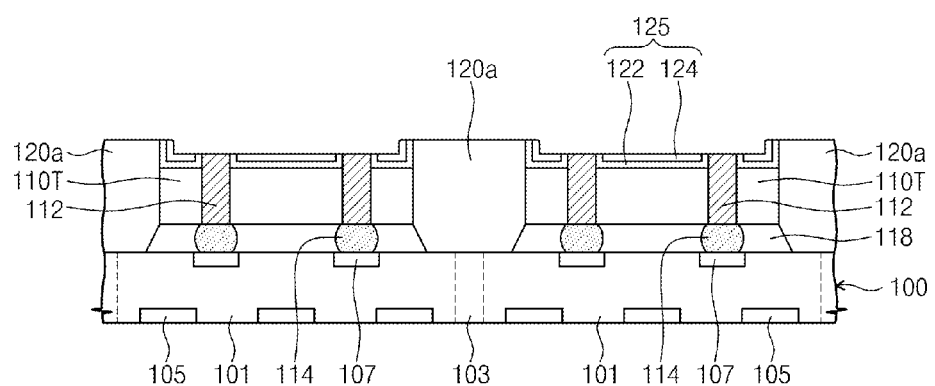
Figure 13:
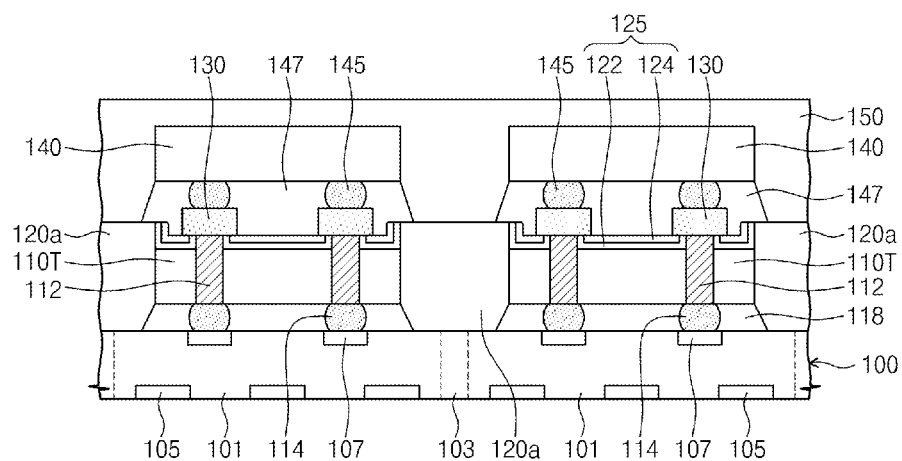

FIGS. 12 and 13 are cross-sectional views illustrating a modified method of manufacturing a semiconductor package according to an example embodiment. A manufacturing method according to this example may include the processes as described with reference to FIGS. 1 to 5.

Referring to FIGS. 5 and 12, the passivation layer 125 on the planarized first mold layer 120a may be removed. At this time, the passivation layer 125 may remain on the etched surface of the thinned first chip 110T. The passivation layer 125 on the planarized first mold layer 120a may be removed by a selective etching process. For example, a mask layer may be formed on the parent substrate 100 and then the mask layer may be patterned to foam an opening exposing the passivation layer 125 on the planarized first mold layer 120a. The exposed passivation layer 125 may be etched and removed using the mask layer the opening as an etch mask. The passivation layer 125 on the planarized first mold layer 120a may be removed after or before the removal of the passivation layer 125 on the through-via electrode 112. Alternatively, the passivation layer 125 on the through-via electrode 112 and the passivation layer 125 on the planarized first mold layer 120a may be removed simultaneously. For example, a mask layer may be formed on the passivation layer 125 and then the mask layer may be patterned to form a first opening and a second opening. The first opening may expose the passivation layer 125 on the through-via electrode 112, and the second opening may expose the passivation layer 125 on the planarized first mold layer 120a. The passivation layer may be etched and removed using the mask layer having the first and second openings as an etch mask. Thus, the through-via electrode 112 and the planarized first mold layer 120a may be exposed.

Referring to FIG. 13, as described with reference to FIGS. 7 and 8, the inter-chip pads 130 may be formed and then the second chip 140 may be mounted on the thinned first chip 110T. Next, the second mold layer 150 may be formed on the parent substrate 100. The second mold layer 150 may be in contact with the top surface of the planarized first mold layer 120a. At this time, an interface exists between the second mold layer 150 and the planarized first mold layer 120a. The top surface of the planarized first mold layer 120a may correspond to the interface, and/or a bottom surface of the second mold layer 150 contacting the planarized first mold layer 120a may correspond to the interface.

Subsequently, the singulation process described with reference to FIG. 9 may be performed on the parent substrate 100 to form a plurality of semiconductor packages separated from each other. After the singulation process, an external bump EXT may be bonded to the external connection pad 105 of the package board 101 of each of the semiconductor packages. Thus, a semiconductor package 201 illustrated in FIG. 19 may be realized.

Figure 14:
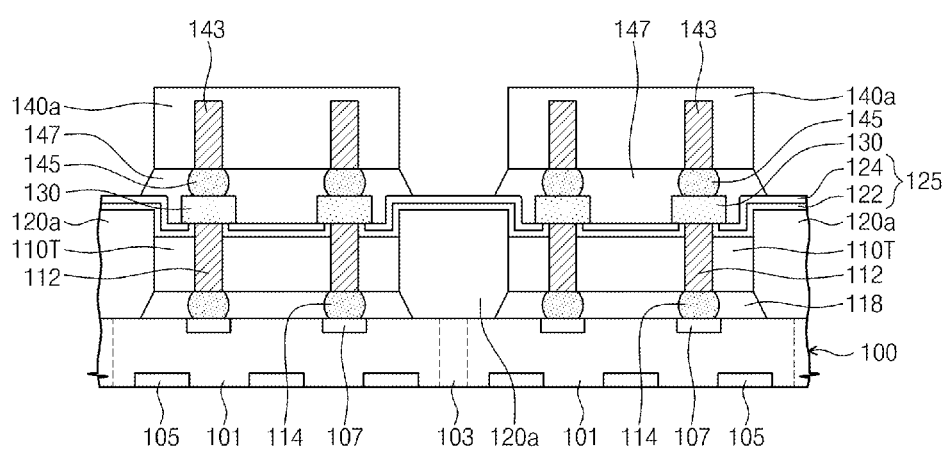
Figure 15:
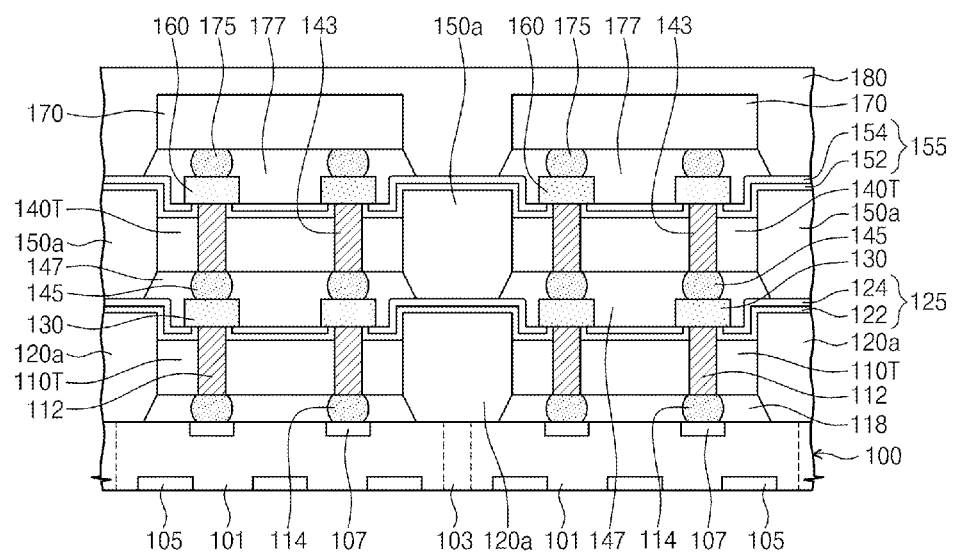

FIGS. 14 and 15 are cross-sectional views illustrating a modified method of manufacturing a semiconductor package according to another example embodiment. According to this modified method, three or more chips may be sequentially stacked on each of the package board parts 101. A manufacturing method according to this example may include the processes as described with reference to FIGS. 1 to 8.

Referring to FIG. 14, a second chip 140a may include at least one second through-via electrode 143. The second chip 140*a* may have a first surface and a second surface opposite to each other, and the first surface of the second chip 140*a* may be adjacent to the thinned first chip 110T. An end of the second through-via electrode 143 may be electrically connected to a second chip bump 145 of the second chip 140*a*. A thickness of the second chip 140*a* may be greater than a height of second through-via electrode 143. In other words, the second chip 140*a* may be sufficiently thick.

Referring to FIG. 15, the processes described with reference to FIGS. 2 to 7 may be repeatedly performed. For example, the second mold layer 150 may be planarized to expose the second chips 140*a*, the exposed second chips 140*a* may be thinned to expose the second through-via electrodes 143. Additionally, a second passivation layer 155 may be formed, and a second inter-chip pad 160 may be formed on one of the exposed second through-via electrodes 143. The planarized second mold layer 150*a* does not cover etched surfaces of the thinned second chips 140T. The second passivation layer 155 may include a first sub-passivation layer 152 and a second sub-passivation layer 154 which are sequentially stacked. The first and second sub-passivation layers 152 and 154 of the second passivation layer 155 may be formed of a same material or different materials. Alternatively, in one example embodiment, the first sub-passivation layer 152 of the second passivation layer 155 may be omitted.

A third chip 170 may be mounted on each of the thinned second chip 140T. The third chip 170 may be a semiconductor chip such as a semiconductor memory device, a logic device, or a system on chip. Alternatively, the third chip 170 may be an interposer. A third chip bump 175 of the third chip 170 may be connected to the second inter-chip pad 160, and a third underfiller 177 may fill a space between the thinned second chip 140T and the third chip 170. The third underfiller 177 may include at least one epoxy molding compound. Thereafter, a third mold layer 180 may be formed on the parent substrate 100. The third mold layer 180 may include at least one epoxy molding compound.

As illustrated in FIG. 15, the second passivation layer 155 may be disposed between the third mold layer 180 and the planarized second mold layer 150*a*. Alternatively, the second passivation layer 155 on the planarized second mold layer 150*a* may be removed as described with reference to FIGS. 12 and 13. In this case, the third mold layer 180 may be in contact with the planarized second mold layer 150*a*. At this time, an interface may exist between the third mold layer 180 and the planarized second mold layer 150*a*.

Subsequently, the singulation process described with reference to FIG. 9 may be performed to divide the parent substrate 100 including the first to third chips 110T, 140T, and 170 into a plurality of semiconductor packages. Next, the external bump EXT may be bonded to the external connection pad 105 of the package board part 101 of each of the semiconductor packages. Thus, a semiconductor package 202 illustrated in FIG. 20 may be realized.

Figure 16:
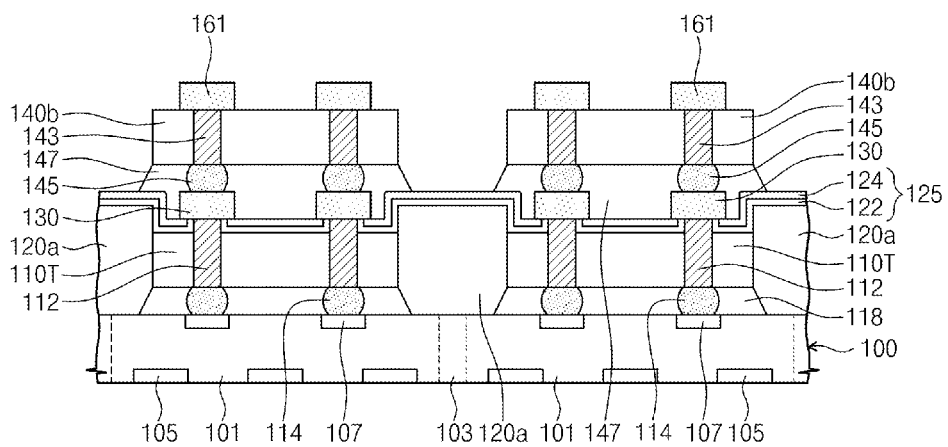
Figure 17:
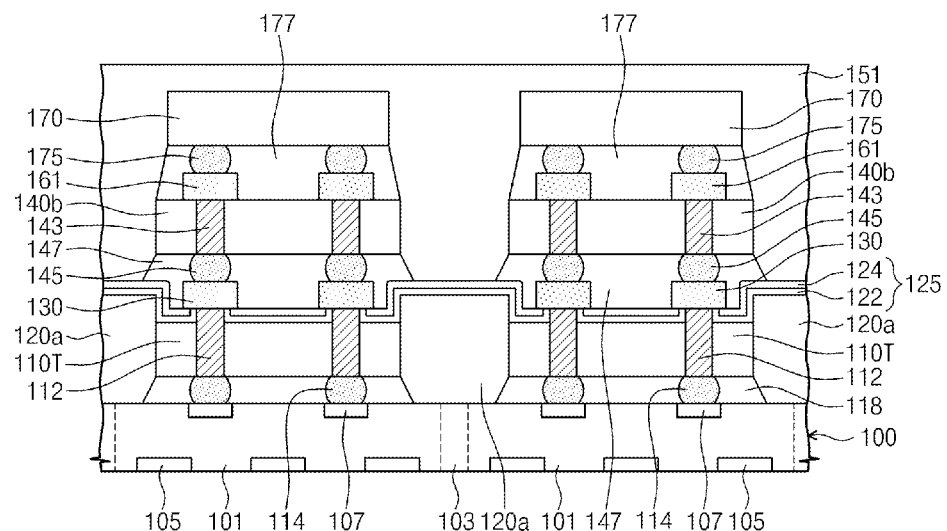

FIGS. 16 and 17 are cross-sectional views illustrating a modified method of manufacturing a semiconductor package according to still another example embodiment. A manufacturing method according to this example may include the processes described with reference to FIGS. 1 and 7.

Referring to FIG. 16, a second chip 140*b* may be mounted on the thinned first chip 110T. The second chip 140*b* may include at least one second through-via electrode 143. Additionally, the second chip 140*b* may further include a second chip bump 145 electrically connected to a bottom end of the second through-via electrode 143, and a second inter-chip pad 161 electrically connected to a top end of the second through-via electrode 143. For example, before the second chip 140*b* is mounted on the thinned first chip 110T, the second chip bump 145 and the second inter-chip pad 161 may be formed on a first surface and a second surface of the second chip 140*b*, respectively.

Referring to FIG. 17, a third chip 170 may be mounted on each of the second chips 140*b*. A third underfiller 177 may fill a space between the second and third chips 140*b* and 170.

Next, a second mold layer 151 may be formed on the parent substrate 100. The second mold layer 151 covers the stacked second and third chips 140*b* and 170. The second mold layer 151 may cover the passivation layer 125 on the planarized first mold layer 120*a*. Alternatively, in one embodiment, the passivation layer 125 on the planarized first mold layer 120*a* may be removed as described with reference to FIGS. 12 and 13. Accordingly, the second mold layer 151 may be in contact with the planarized first mold layer 120*a*. As such, an interface exists between the second mold layer 151 and the planarized first mold layer 120*a*, and the top surface of the planarized first mold layer 120*a* may correspond to the interface.

Figure 21:
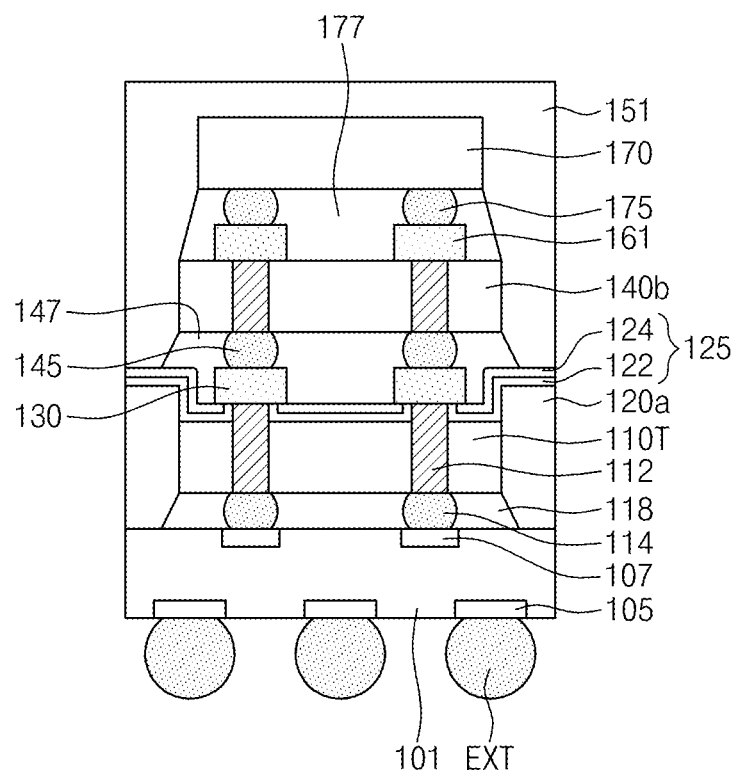

Subsequently, the singulation process and the boning process of the external bump EXT described with reference to FIG. 9 may be performed to realize a semiconductor package 203 as illustrated in FIG. 21.

Next, the semiconductor packages according to example embodiments will be described with reference to the drawings.

Figure 18:
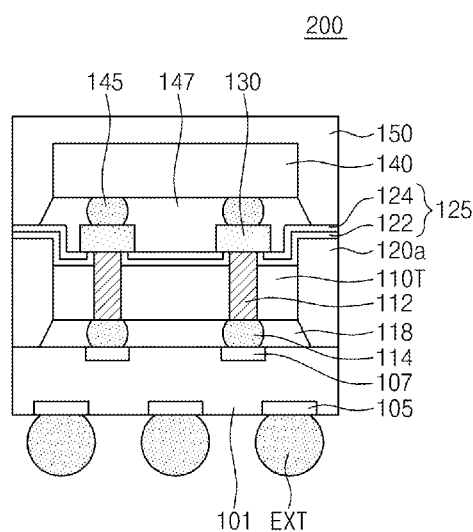

FIG. 18 is a cross-sectional view illustrating a semiconductor package according to an example embodiment.

Referring to FIG. 18, a semiconductor package 200 according to an example embodiment may include a thinned first chip 110T mounted on a package board 101 and a second chip 140 mounted on the thinned first chip 110T. The package board 101 may include external connection pads 105 disposed on a bottom surface of the package board 101 and internal connection pads 107 disposed on a top surface of the package board 101. The thinned first chip 110T may have a first surface and a second surface opposite to each other. The first surface of the thinned first chip 110T may be adjacent to the package board 101. The thinned first chip 110T may include through-via electrodes 112 penetrating the thinned first chip 110T. The thinned first chip 110T may have first chip bumps 114 disposed on the first surface thereof. The first chip bumps 114 may be electrically connected to bottom ends of the through-via electrodes 112, respectively. The first chip bumps 114 of the thinned first chip 110T may be connected to the internal connection pads 107 of the package board 101, respectively. A first underfiller 118 may fill a space between the thinned first chip 110T and the package board 101. The first chip bumps 114 may be surrounded by the first underfiller 118.

A first mold layer may be disposed on the package board 101 and surround a sidewall of the thinned first chip 110T. The first mold layer may be planarized to have a planarized top surface, thereby forming a planarized first mold layer 120*a*. The planarized first mold layer 120*a* may be disposed on an edge region of the top surface of the package board 101. The top surface of the planarized first mold layer 120*a* may be disposed around the thinned first chip 110T. The top surface of the planarized first mold layer 120*a* may not cover the second surface of the thinned first chip 110T. In other words, the first mold layer may be formed such that the planarized top surface of the thinned first chip 110T is exposed. The planarized top surface of the first mold layer 120*a* may be disposed at a level higher than the second surface of the thinned first chip 110T.

A passivation layer 125 may be disposed on the second surface of the thinned first chip 110T. For example, the passivation layer 125 may extend to cover the planarized top surface of the first mold layer 120a. The passivation layer 125 may include a first sub-passivation layer 122 and a second sub-passivation layer 124 which are sequentially stacked. The second sub-passivation layer 124 may include a polymer insulating layer. For example, the second sub-passivation layer 124 may include a polyimide layer. The first sub-passivation layer 122 may include a CVD insulating layer. For example, the first sub-passivation layer 122 may include a CVD oxide layer, a CVD nitride layer, and/or a CVD oxynitride layer.

Inter-chip pads 130 may be disposed between the thinned first chip 110T and the second chip 140. The inter-chip pads 130 may be connected to top ends of the through-via electrodes 112, respectively. The inter-chip pad 130 may be disposed on the passivation layer 125.

Second chip bumps 145 of the second chip 140 may be connected to the inter-chip pads 130, respectively. A second underfiller 147 may fill a space between the thinned first chip 110T and the second chip 140.

A second mold layer 150 may be disposed on the first mold layer 120a. The second mold layer 150 may surround at least a sidewall of the second chip 140. For example, the second mold layer 150 may cover a top surface of the second chip 140 as illustrated in FIG. 18.

For example, the passivation layer 125 may be disposed between the second mold layer 150 and the planarized top surface of the first mold layer 120a. Thus, the first mold layer 120a may be distinguished from the second mold layer 150.

External bumps EXT may be bonded to the external connection pads 105 of the package board 101, respectively.

Figure 19:
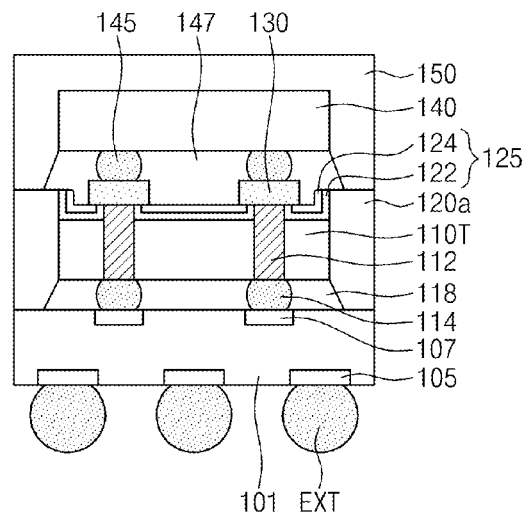

FIG. 19 is a cross-sectional view illustrating a modified semiconductor package according to an example embodiment.

Referring to FIG. 19, in a semiconductor package 201 according to this example, the second mold layer 150 may be in contact with the planarized top surface of the first mold layer 120a. Accordingly, an interface exists between the first mold layer 120a and the second mold layer 150. The planarized top surface of the first mold layer 120a may correspond to the interface, and/or a bottom surface of the second mold layer 150 in contact with the first mold layer 120a may correspond to the interface.

For example, the passivation layer 125 may be confinedly disposed on the second surface of the thinned first chip 110T.

Figure 20:
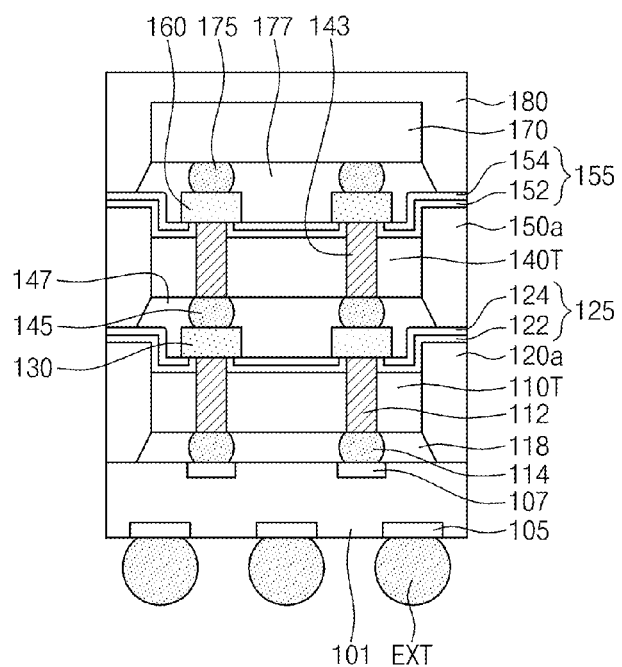

FIG. 20 is a cross-sectional view illustrating a modified semiconductor package according to another example embodiment.

Referring to FIG. 20, a semiconductor package 202 according to this example may include a thinned first chip 110T, a thinned second chip 140T, and a third chip 170 which are sequentially stacked on the package board 101. The thinned first chip 110T may include first through-via electrodes 112 and first chip bumps 114 electrically connected to bottom ends of the first through-via electrodes 112, respectively. The thinned second chip 140T may include second through-via electrodes 143 and second chip bumps 145 electrically connected to bottom ends of the second through-via electrodes 143, respectively. The third chip 170 may include third chip bumps 175. A first inter-chip pad 130 may be disposed between each of the first through-via electrodes 112 and each of the second chip bumps 145, and a second inter-chip pad 160 may be disposed between each of the second through-via electrodes 143 and each of the third chip bumps 175.

A first underfiller 118 may fill a space between the thinned first chip 110T and the package board 101, a second underfiller 147 may fill a space between the thinned first chip 110T and the thinned second chip 140T, and a third underfiller 177 may fill a space between the thinned second chip 140T and the third chip 170.

A planarized first mold layer 120a may be disposed on the edge region of the top surface of the package board 101 to surround the sidewall of the thinned first chip 110T. The planarized first mold layer 120a has a planarized top surface and may not cover the second surface (i.e., the top surface) of the thinned first chip 110T. A planarized second mold layer 150a may be disposed on the first mold layer 120a to surround the sidewall of the thinned second chip 140T. The planarized second mold layer 150a may also include a planarized top surface. The thinned second chip 140T has a first surface adjacent to the thinned first chip 110T and a second surface opposite to the first surface. The second mold layer 150a may not cover the second surface of the thinned second chip 140T. In other words, the planarized second mold layer 150a may be provided such that the second surface of the thinned second chip 140T is exposed A third mold layer 180 may be disposed on the second mold layer 150a and surround at least a sidewall of the third chip 170. For example, the third mold layer 180 may extend to cover a top surface of the third chip 170.

A first passivation layer 125 may be disposed between the planarized top surface of the first mold layer 120a and the second mold layer 150a. A second passivation layer 155 may be disposed between the planarized top surface of the second mold layer 150a and the third mold layer 180. The second passivation layer 155 may extend to be disposed on the second surface of the thinned second chip 140T. The second passivation layer 155 may include sequentially stacked first and second sub-passivation layers 152 and 154. The first and second sub-passivation layers 152 and 154 of the second passivation layer 155 may be formed of a same material or different materials.

For example, the first passivation layer 125 between the planarized first and second mold layers 120a and 150a and/or the second passivation layer 155 between the planarized second mold layer 150a and the third mold layer 180 may be removed. Accordingly, the planarized first and second mold layers 120a and 150a may be in contact with each other, and/or the planarized second mold layer 150a and the third mold layer 180 may be in contact with each other. As such, an interface may exist between the planarized first and second mold layers 120a and 150a, and/or an interface may exist between the planarized second mold layer 150a and the third mold layer 180.

According to this example embodiment, the semiconductor package 202 includes stacked three chips 110T, 140T, and 170. However, the inventive concepts are not limited thereto. The semiconductor package 202 may include stacked four or more chips.

FIG. 21 is a cross-sectional view illustrating a modified semiconductor package according to still another example embodiment.

Referring to FIG. 21, a semiconductor package 203 according to this example may include first, second, and third chips 110T, 140b, and 170, which are sequentially stacked on the package board 101. The planarized first mold layer 120a may be disposed on the edge region of the top surface of the package board 101 and may surround the sidewall of the thinned first chip 110T. A second mold layer 151 may be disposed on the planarized first mold layer 120a and may surround sidewalls of the second and third chips 140b and 170. The second mold layer 151 may extend to cover the top surface of the third chip 170. As illustrated in FIG. 21, the passivation layer 125 may be disposed between the top surface of the planarized first mold layer 120a and the second mold layer 151. Alternatively, the passivation layer 125 between the planarized first mold layer 120a and the second mold layer 151 may be removed. Accordingly, the second mold layer 151 may be in contact with the planarized top surface of the first mold layer 120a. As such, an interface may exist between the first and second mold layers 120a and 151.

According to this example embodiment, the semiconductor package 203 includes stacked three chips 110T, 140b, and 170. However, the inventive concepts are not limited thereto. The semiconductor package 203 may include stacked four or more chips.

Second Embodiment

In this example embodiment, the same elements as described in the first embodiment will be indicated by the same reference numerals or the same reference designators. For convenience of explanation, the descriptions to the same elements as in the first embodiment will be omitted or mentioned briefly. Thus, differences between the present embodiment and the first embodiment will be mainly described hereinafter.

FIGS. 22 to 26 are cross-sectional views illustrating a method of manufacturing a semiconductor package according to another example embodiment. FIG. 27 is a perspective view illustrating a structure shown in FIG. 25.

Figure 22:
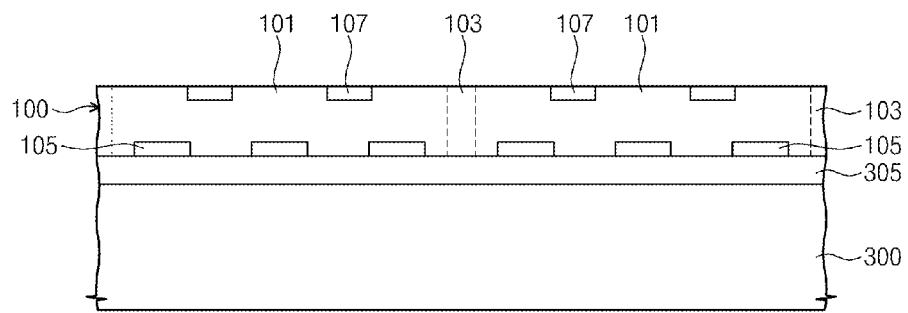

Referring to FIG. 22, a parent substrate 100 including a plurality of package board parts 101 and a scribe region 103 therebetween may be prepared. The parent substrate 100 may be bonded to a top surface of a carrier substrate 300. For example, an adhesive layer 305 may be formed on the top surface of the carrier substrate 300, and then the parent substrate 100 may be bonded to the top surface of the carrier substrate 300 by using the adhesive layer 305.

The carrier substrate 300 may be formed of a glass or a semiconductor material. For example, the carrier substrate 300 may be a glass substrate or a silicon substrate. The adhesive layer 305 may include an adhesive material, an adhesive force of which is decreased or lost by heat or light.

A bottom surface of the parent substrate 100 may be bonded to the carrier substrate 300. External connection pads 105 of the package board parts 101 may be formed on the bottom surface of the parent substrate 100.

Figure 23:
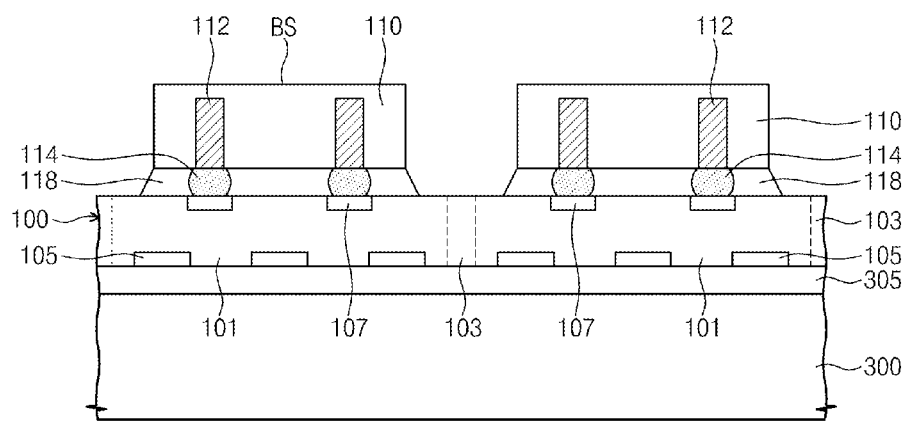

Referring to FIG. 23, the first chip 110 may be mounted on each of the package board parts 101 as described with reference to FIG. 1. For example, the thickness of the first chip 110 may be greater than the height of the through-via electrode 112 in the first chip 110.

Figure 24:
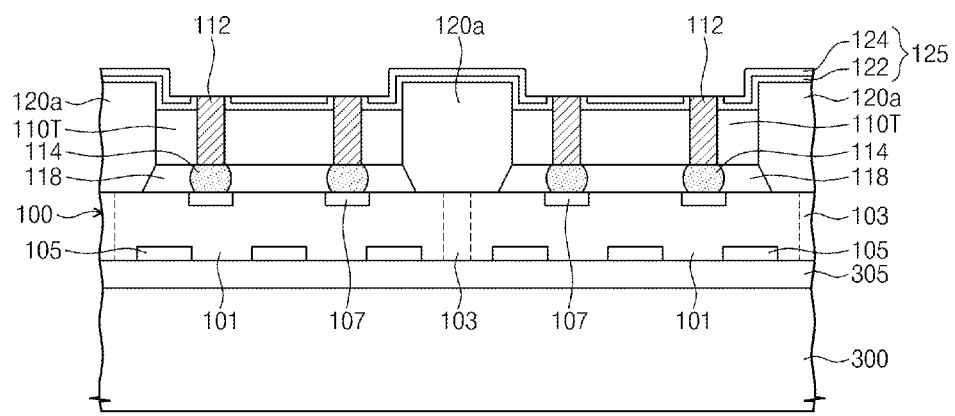

Referring to FIG. 24, the processes described with reference to FIGS. 2 to 6 may be performed on the parent substrate 100 bonded to the carrier substrate 300. For example, after the planarized first mold layer 120a is formed to surround the first chip 110, a thinning process may be performed on the first chip 110. The first chip 110 may be thinned to expose the through-via electrode 112. In the event that the passivation layer 125 is formed to cover the through-hole electrode 112, the through-via electrode 112 may be processed to be re-exposed.

Figure 25:
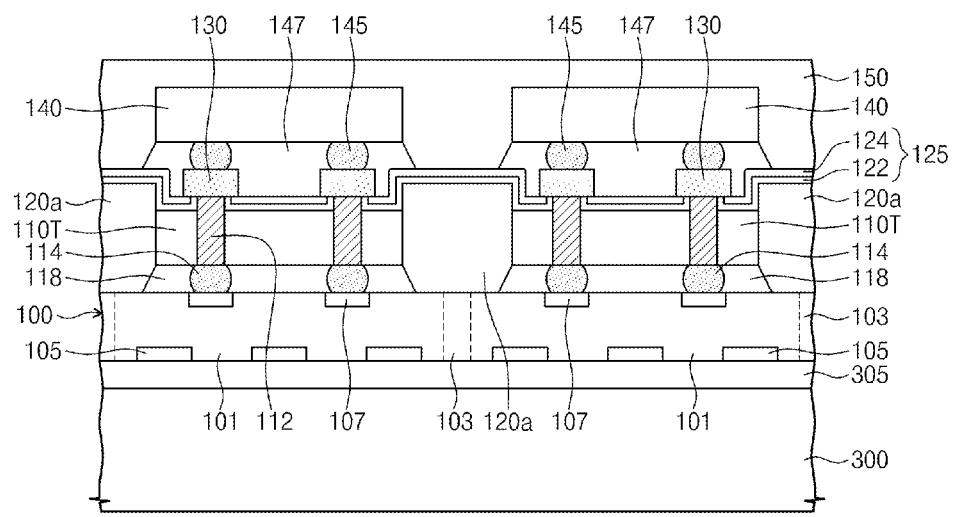

Referring to FIG. 25, as described with reference to FIGS. 7 to 9, an inter-chip pad 130 may be formed on each of the through-via electrodes 112, the second chip 140 may be mounted on the thinned first chip 110T, and then the second mold layer 150 may be formed on the parent substrate 100 bonded to the carrier substrate 300. Thus, a semiconductor package structure including a plurality of semiconductor packages may be formed. FIG. 25 shows an example of the semiconductor package structure formed thereby. The semiconductor package structure may include the carrier substrate 300, the parent substrate 100, a plurality of the chips 110T and 140 stacked on each of the package board parts 101, the first mold layer 120a, and the second mold layer 150. According to the inventive concepts, the semiconductor package structure may have other shapes. For example, the semiconductor package structure may be realized as one of semiconductor package structures illustrated below in FIGS. 29, 30, 31, 33, and 37. Further, the semiconductor package structure may have a circular plate as illustrated in FIG. 27.

Figure 26:
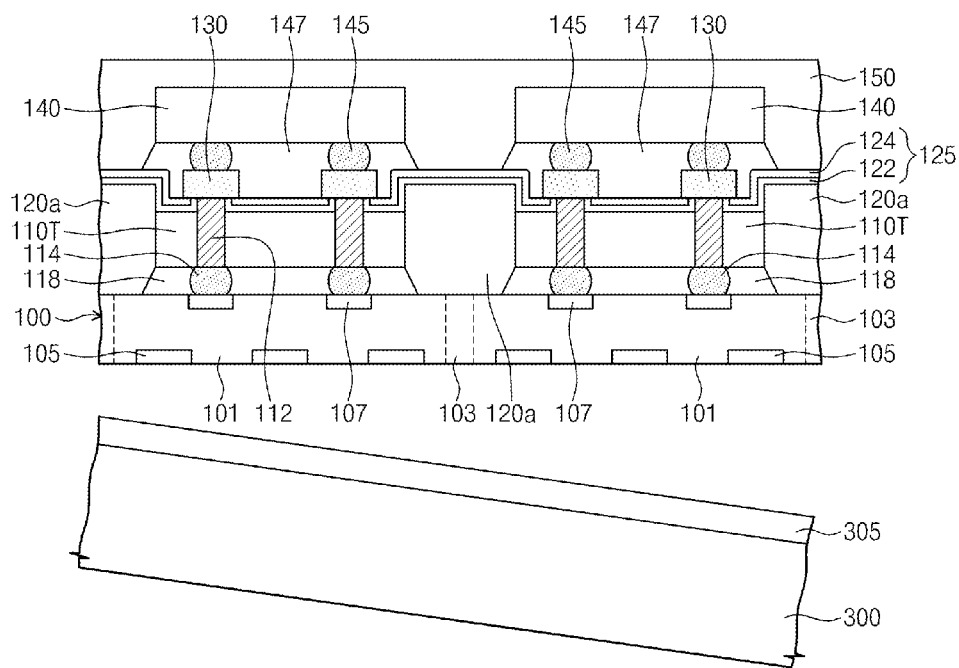
Figure 27:
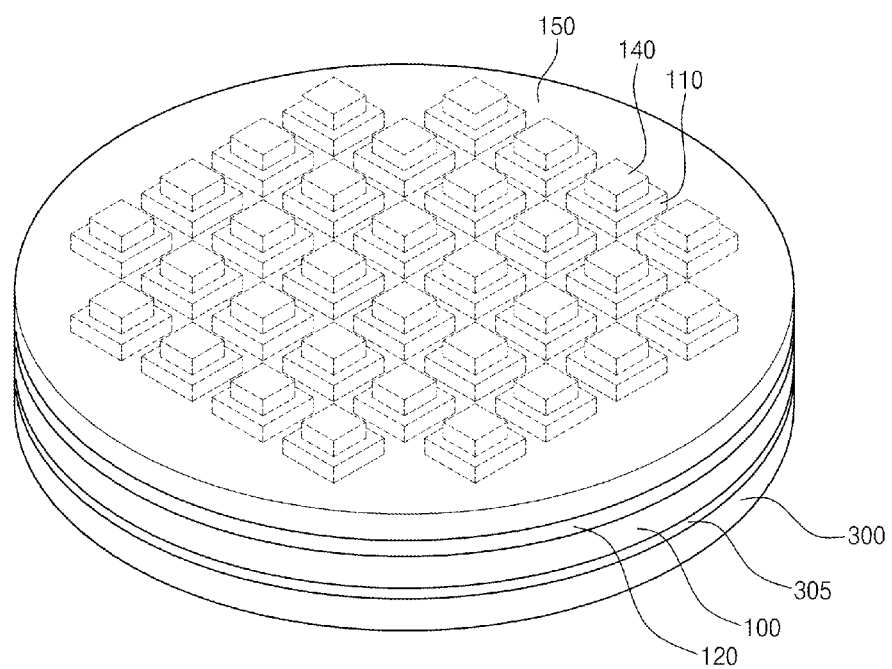

Referring to FIG. 26, after the packaging process is performed, the carrier substrate 300 may be separated from the parent substrate 100. For example, heat may be supplied to the adhesive layer 305 so that the adhesive force of the adhesive layer 305 may be decreased or lost. Thus, the carrier substrate 300 may be separated from the parent substrate 100. For example, if the carrier substrate 300 is the glass substrate, ultraviolet rays may be irradiated to the adhesive layer 305 through a back side of the carrier substrate 300. Accordingly, the adhesive force of the adhesive layer 305 may be decreased or lost such that the carrier substrate 300 may be easily separated from the parent substrate 100. However, the inventive concepts are not limited thereto. The carrier substrate 300 may be separated from the parent substrate 100 by a physical separating method and/or a chemical separating method.

Subsequently, the singulation process described with reference to FIG. 9 may be performed, and then the external bump EXT may be bonded to the external connection pad 105 of the package board 101 to realize the semiconductor package 200 illustrated in FIG. 18.

For example, after the parent substrate 100 is bonded to the carrier substrate 300, the packaging process may be performed on the parent substrate 100 bonded to the carrier substrate 300. Thus, even though the parent substrate 100 is thin, the carrier substrate 300 may support the parent substrate 100 to prevent or minimize a warpage phenomenon of the parent substrate 100. Additionally, the carrier substrate 330 may support the parent substrate 100, so that it is possible to improve a process margin of the thinning process performed on the first chips 110, which are disposed on the parent substrate 100.

Next, various modified examples of the above embodiment will be described herein below with reference to the accompanying drawings.

Figure 28:
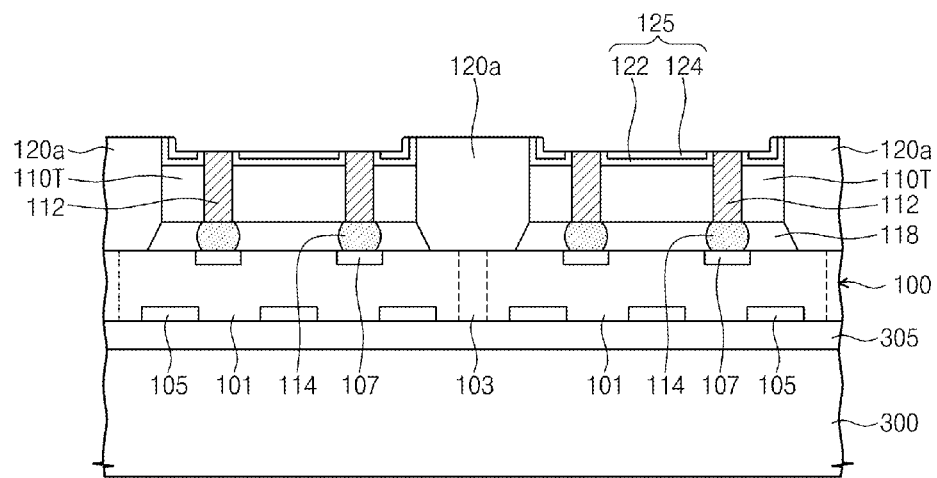
Figure 29:
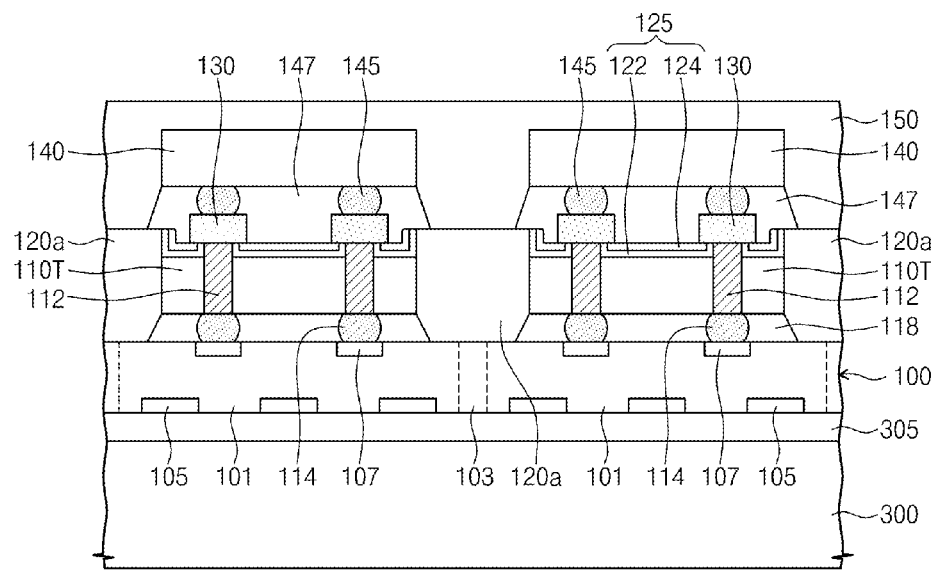

FIGS. 28 and 29 are cross-sectional views illustrating a method of manufacturing a semiconductor package according to an example embodiment.

Referring to FIG. 28, the passivation layer 125 on the planarized first mold layer 120a may be removed from the parent substrate 100 bonded to the carrier substrate 300, as described with reference to FIGS. 12 and 13.

Referring to FIG. 29, the second chip 140 may be mounted on each of the thinned first chip 110T and then the second mold layer 150 may be formed, as described with reference to FIG. 13. Thus, a semiconductor package structure of FIG. 29 may be realized.

Thereafter, as described with reference to FIG. 26, the carrier substrate 300 may be separated from the parent substrate 300. Subsequently, the singulation process described with reference to FIG. 9 may be performed and then the external bump EXT may be bonded to the external connection pad 105 of the package board 101. As a result, the semiconductor package 201 of FIG. 19 may be realized.

Figure 30:
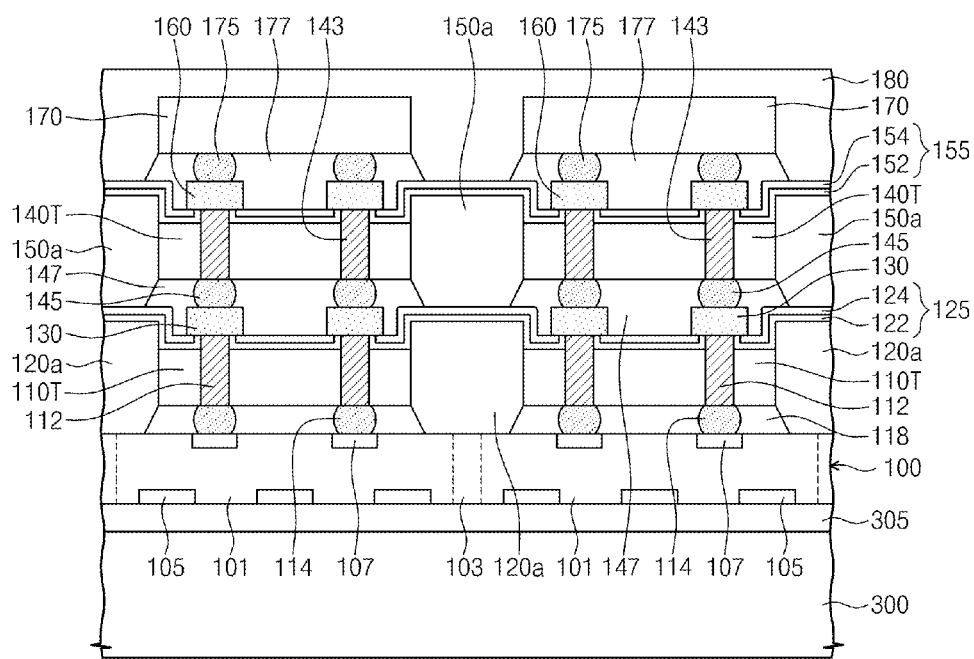

FIG. 30 is cross-sectional view illustrating a method of manufacturing a semiconductor package according to another embodiment. A manufacturing method according to this example may include the processes described with reference to FIGS. 22 to 24.

Referring to FIG. 30, the processes described with reference to FIGS. 14 and 15 may be performed on the structure illustrated in FIG. 24 such that the first, second, and third chips 110T, 140T, and 170 may be sequentially stacked on each of the package board parts 101 of the parent substrate 100 bonded to the carrier substrate 300. Additionally, the first, second and third mold layers 120a, 150a, and 180 may be formed. Thus, a semiconductor package structure illustrated in FIG. 30 may be realized.

Subsequently, the carrier substrate 300 may be separated from the parent substrate 100 as described with reference to FIG. 26. The singulation process described with reference to FIG. 9 may be performed and then the external bump EXT may be bonded to the external connection pad 105 of the package board 101. As a result, the semiconductor package 202 of FIG. 20 may be realized.

Figure 31:
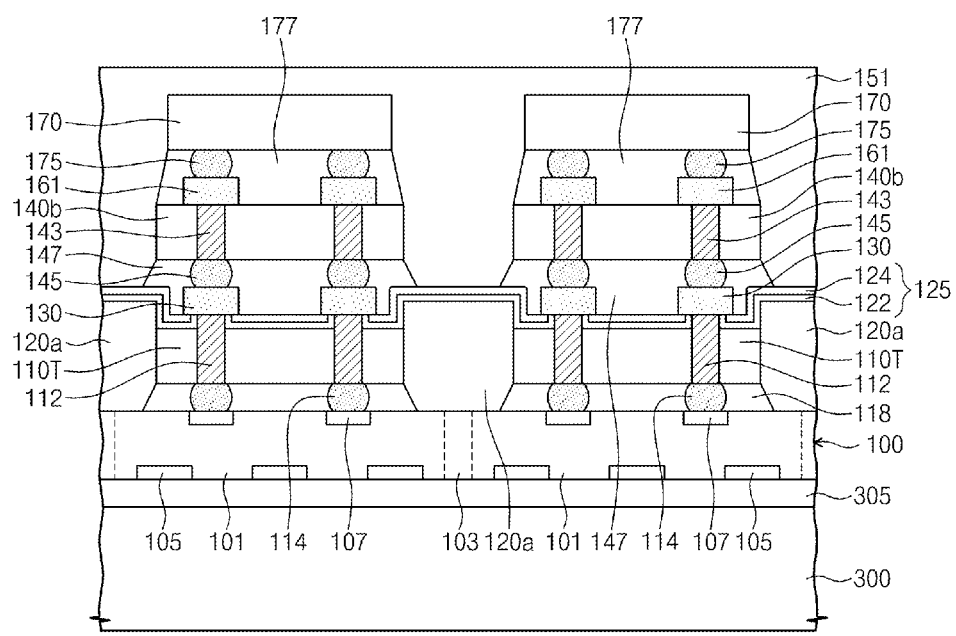

FIG. 31 is cross-sectional view illustrating a method of manufacturing a semiconductor package according to still another embodiment. A manufacturing method according to this example may include the processes described with reference to FIGS. 22 to 24.

Referring to FIG. 31, the processes described with reference to FIGS. 16 and 17 may be performed on the structure illustrated in FIG. 24 such that the first, second, and third chips 110T, 140b, and 170 may be sequentially stacked on each of the package board parts 101 of the parent substrate 100 bonded to the carrier substrate 300. Additionally, the first and second mold layers 120a and 151 may be formed. Thus, a semiconductor package structure of FIG. 31 may be realized.

Subsequently, the carrier substrate 300 may be separated from the parent substrate 100 as described with reference to FIG. 26. Next, the singulation process described with reference to FIG. 9 may be performed and then the external bump EXT may be bonded to the external connection pad 105 of the package board 101. As a result, the semiconductor package 203 of FIG. 21 may be realized.

Figure 32:
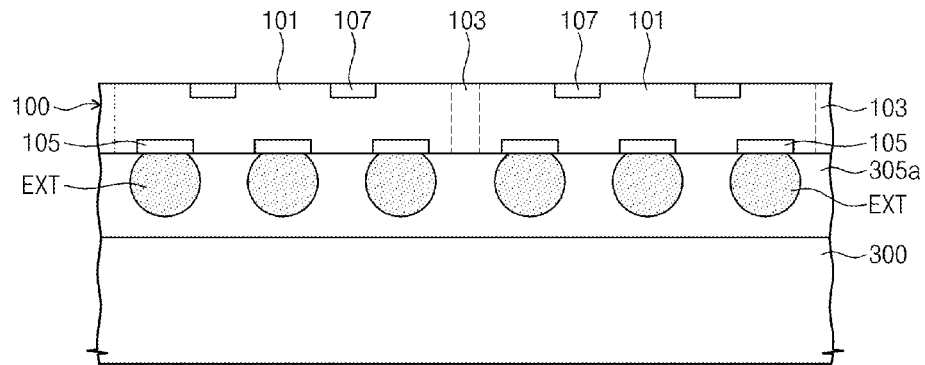
Figure 33:
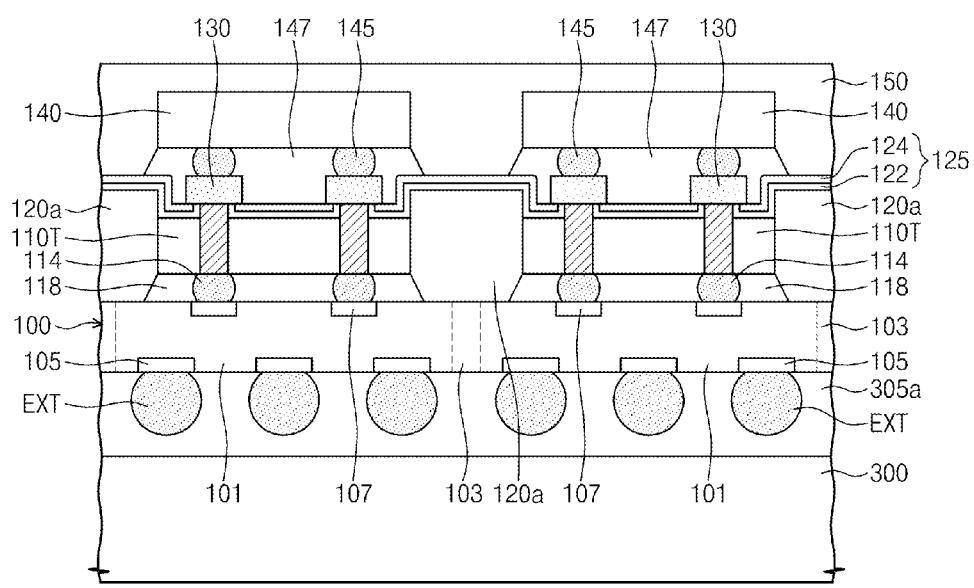

FIGS. 32 and 33 are cross-sectional views illustrating a method of manufacturing a semiconductor package according to yet another embodiment. According to this example, before the parent substrate 100 is bonded to the carrier substrate 300, the external bump EXT may be bonded to the external connection pad 105 of the parent substrate 100.

Referring to FIG. 32, the external bumps EXT may be bonded to the external connection pads 105 of the parent substrate 100. Subsequently, the parent substrate 100 having the external bumps EXT may be bonded to the carrier substrate 300. For example, the external bumps EXT may be disposed in an adhesive layer 305a disposed between the parent substrate 100 and the carrier substrate 300.

Referring to FIG. 33, subsequently, the processes described with reference to FIGS. 23 to 25 may be performed to realize a semiconductor package structure illustrated in FIG. 33.

Next, the carrier substrate 300 may be separated from the parent substrate 100 and the external bumps EXT by the method described with reference to FIG. 26. Thereafter, the singulation process described with reference to FIG. 9 may be performed.

The formation method of the external bump EXT according to this example may be applied to the modified examples described with reference to FIGS. 28 to 31.

FIGS. 34, 35, 36, 37 and 38 are cross-sectional views illustrating a method of manufacturing a semiconductor package according to other a further example embodiment. According to this example, a through-via electrode may be formed in a first chip after the first chip is mounted on the parent substrate 100.

Figure 34:
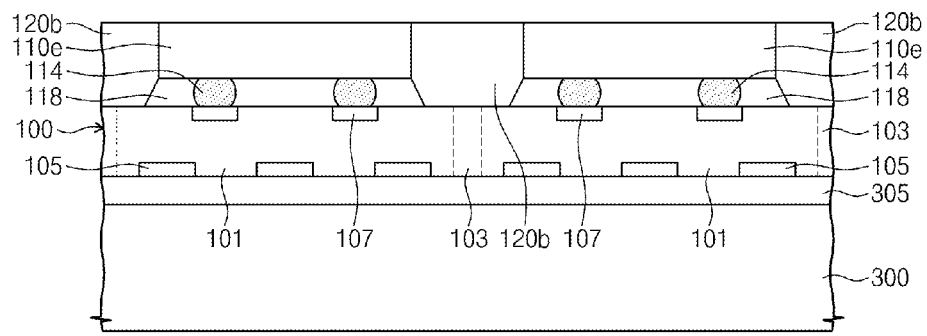

Referring to FIG. 34, after the parent substrate 100 is bonded to the carrier substrate 300, a first chip 110e may be mounted on each of the package board parts 101 of the parent substrate 100. At this time, the first chip 110e may not include a through-via electrode. The first chip 110e may include a first chip bump 114, and the first chip bump 114 of the first chip 110e may be connected to the internal connection pad 107 of the package board part 101. The first underfiller 118 may fill a space between the first chip 110e and the package board part 101.

Subsequently, a first mold layer may be formed on the parent substrate 100, and then the first mold layer may be planarized until the first chips 110e are exposed. The planarized first mold layer 120b may have a top surface substantially coplanar with the exposed surfaces of the first chips 110e.

Figure 35:
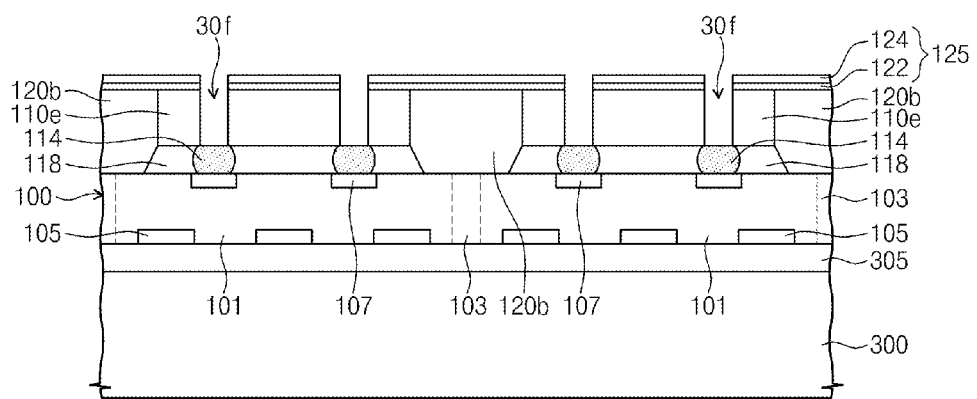

Referring to FIG. 35, the passivation layer 125 may be formed on the top surface of the planarized first mold layer 120b and the exposed surfaces of the first chips 110e.

Next, a via-hole 30f may be formed to penetrate the passivation layer 125 and the first chip 110e. A plurality of the via-holes 30f may be formed on the parent substrate 100. The via-hole 30f may expose the first chip bump 114. Alternatively, the via-hole 30f may expose the metal interconnection 50 of FIG. 11A, the lower interconnection 15 of FIG. 11B, or the interconnecting pad 90 of FIG. 11C.

Figure 36:
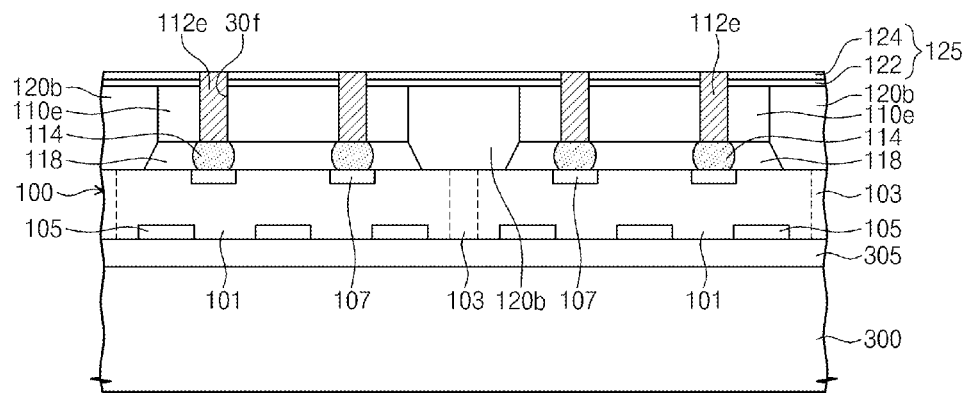

Referring to FIG. 36, through-via electrodes 112e may be formed in the via-holes 30f, respectively. The through-via electrode 112e may be electrically connected to the first chip bump 114. Before the through-via electrode 112e is formed, a via-insulating layer may be conformally formed in the via-hole 30f and then the via-insulating layer may be anisotropically etched until the conductor (e.g., the chip bump 114) under the via-hole 30f is exposed. Thus, the via-insulating layer may be confinedly disposed between an inner sidewall of the via-hole 30f and the through-via electrode 112e. As a result, the through-via electrode 112e may be insulated from the first chip 110e and be connected to the conductor under the via-hole 30f.

Figure 37:
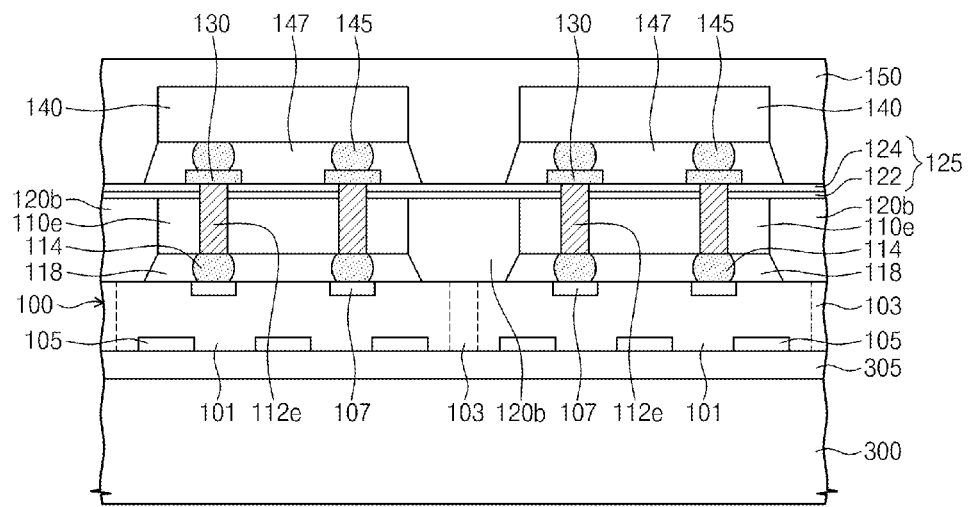

Next, referring to FIG. 37, the inter-chip 130 may be formed on each of the through-via electrode 112e, and then the second chip 140 may be mounted on each of the first chips 110e. Thereafter, the second mold layer 150 may be formed to realize a semiconductor package structure illustrated in FIG. 37.

Subsequently, the carrier substrate 300 may be separated from the parent substrate 100 as described with reference to FIG. 26. The singulation process of FIG. 9 may be performed and then the external bump EXT may be bonded to the external connection pad 105 of the package board 101. As a result, a semiconductor package illustrated in FIG. 38 may be realized.

Figure 38:
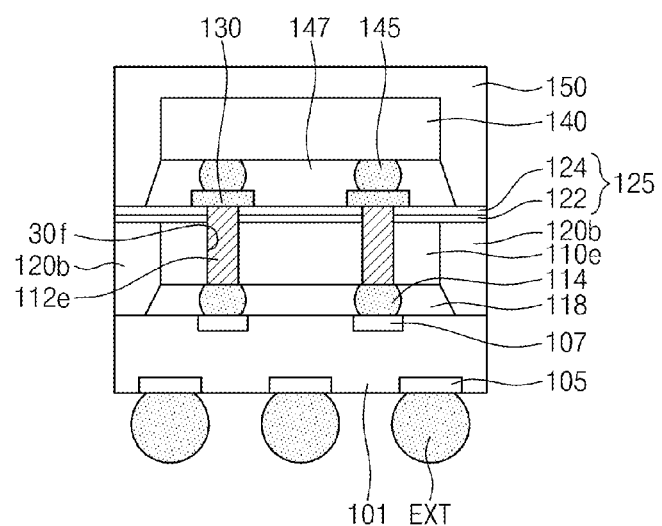

Referring to FIG. 38, the top surface of the planarized first mold layer 120b may be substantially coplanar with the top surface of the first chip 110e. Thus, the passivation layer 125 may be substantially flat.

Figure 39:
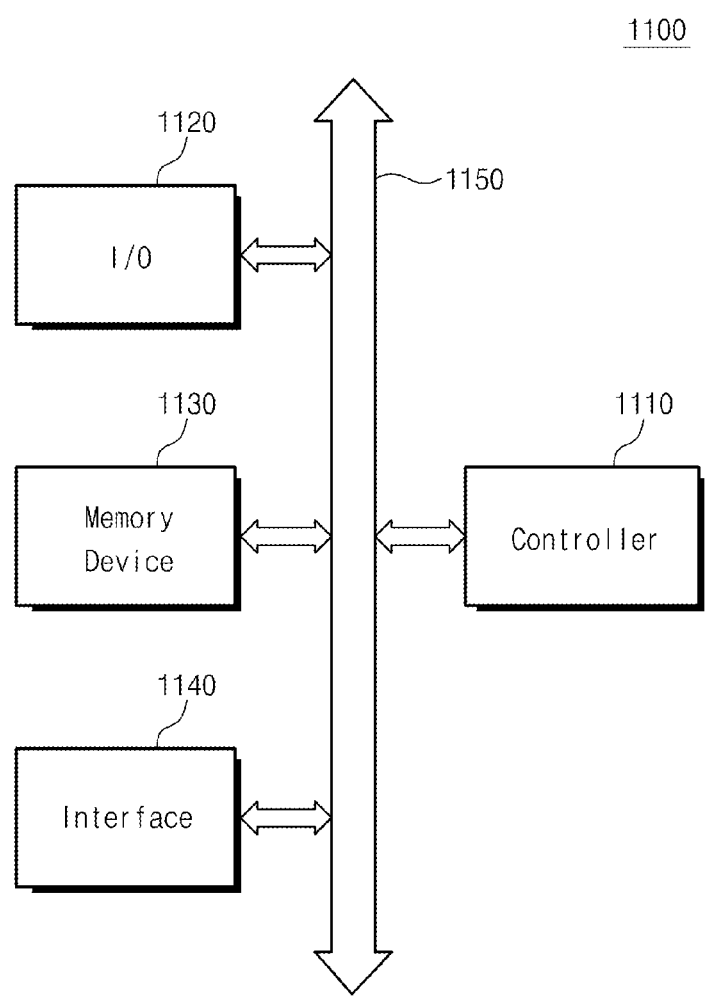

FIG. 39 is a schematic block diagram illustrating an electronic system including semiconductor packages according to example embodiments.

Referring to FIG. 39, an electronic system 1100 according to this embodiment may include a controller 1110, an input/ output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller and other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. If the semiconductor packages according to the aforementioned embodiments include logic devices, the controller 1110 may include at least one of the semiconductor packages described above.

If the semiconductor packages according to the aforementioned embodiments include semiconductor memory devices, the memory device 1130 may include at least one of the semiconductor packages according to the aforementioned embodiments. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 40:
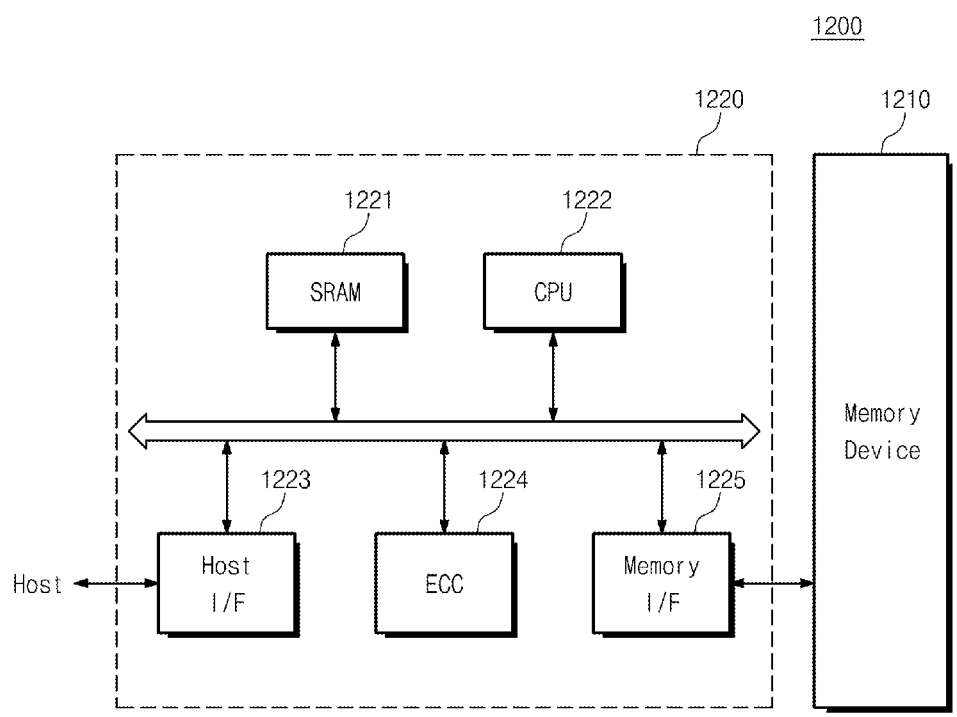

FIG. 40 is a schematic block diagram illustrating a memory card including semiconductor packages according to example embodiments.

Referring to FIG. 40, a memory card 1200 according to this embodiment may include a memory device 1210. If the semiconductor packages according to the aforementioned embodiments include semiconductor memory devices, the memory device 1210 may include at least one of the semiconductor packages according to the embodiments mentioned above. The memory card 1200 may further include a memory controller 1220 that controls data communication between a host and the memory device 1210.

The memory controller 1220 may include a central processing unit (CPU) 1222 that controls overall operations of the memory card 1200. If the semiconductor packages according to the aforementioned embodiments include logic devices, the CPU 1222 may include at least one of the semiconductor packages according to the embodiments mentioned above. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

As described above, the first chip may be mounted on the parent substrate and then the first chip is thinned. The passivation layer may be formed on the etched surface of the thinned first chip. Thus, the first chip having the thick thickness may be mounted on the parent substrate and thus the first chip may be easily handled. Additionally, because the passivation layer is formed on the etched surface of the thinned first chip, the thinned first chip may be protected. As a result, the manufacturing yield of the semiconductor packages may increase, and manufacturing time of the semiconductor packages may be reduced. Thus, the productivity of the semiconductor packages may be improved. Additionally, the reliability of the semiconductor packages may be improved.

Additionally, the parent substrate may be bonded to the carrier substrate before the first chip is mounted on the parent substrate. Thus, even though the parent substrate is thin, the carrier substrate may support the parent substrate to prevent or minimize the warpage phenomenon of the parent substrate. Additionally, because the carrier substrate supports the parent substrate, it is possible to improve the process margin of the thinning process performed on the first chips disposed on the parent substrate. As a result, manufacturing yield of the semiconductor packages may increase, and manufacturing time of the semiconductor packages may be reduced. Thus, the productivity of the semiconductor packages may be improved. Additionally, the reliability of the semiconductor packages and/or the semiconductor package structures may be improved.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A method of manufacturing a semiconductor package comprising:

preparing a parent substrate including a plurality of package board parts laterally spaced apart from each other;

mounting first chips on the package board parts such that each of the first chips is mounted on a different one of the package board parts, each of the first chips including at least one through-via electrode, back sides of the first chips covering the through-via electrodes;

forming a first mold layer on the parent substrate having the first chips;

planarizing the first mold layer to expose the back sides of the first chips;

etching the exposed back sides of the first chips to thin the first chips and to expose back sides of the through-via electrodes;

forming a passivation layer on the planarized first mold layer, the etched back sides of the first chips, and the back sides of the through-via electrodes; and selectively removing the passivation layer disposed on the back sides of the through-via electrodes to expose the back sides of the through-via electrodes.

2. The method of claim 1, wherein the passivation layer includes a polymer insulating layer.

3. The method of claim 2, wherein
the passivation layer includes a first sub-passivation layer and a second sub-passivation layer which are sequentially stacked;
the first sub-passivation layer includes at least one chemical vapor deposition (CVD) insulating layer; and
the second sub-passivation layer includes the polymer insulating layer.

4. The method of claim 1, further comprising:
mounting second chips on the passivation layer; and
forming a second mold layer on the parent substrate including the first and second chips,
wherein each of the second chips is electrically connected to the back side of the through-via electrode of a corresponding one of the thinned first chips.

5. The method of claim 4, further comprising:
forming inter-chip pads on the exposed back sides of the through-via electrodes after selectively removing the passivation layer and before mounting the second chips,
wherein the second chips are electrically connected to the through-via electrodes through the inter-chip pads.

6. The method of claim 4, wherein
a portion of the passivation layer remains on the planarized first mold layer after selectively removing the passivation layer disposed on the back sides of the through-via electrodes; and
the second mold layer is formed on the remaining passivation layer.

7. The method of claim 4, further comprising:
removing the passivation layer disposed on the planarized first mold layer,
wherein the passivation layer on the etched back sides of the first chips remain after the removing the passivation layer disposed on the planarized first mold layer.

8. The method of claim 4, further comprising:
planarizing the second mold layer to expose the second chips;
mounting third chips on the second chips; and
forming a third mold layer on the parent substrate including the third chips.

9. The method of claim 1, further comprising:
bonding the parent substrate to a carrier substrate before mounting the first chips on the package board parts.

10. The method of claim 1, wherein the exposed back sides of the first chips are etched so that the through-via electrodes protrude from the etched back sides of the thinned first chips.

11. A method of manufacturing a semiconductor package comprising:
preparing a parent substrate including a plurality of package board parts laterally spaced apart from each other;
mounting first chips on the package board parts;
forming a first mold layer on the parent substrate having the first chips;
planarizing the first mold layer to expose the first chips;
forming via-holes in the exposed first chips;
forming through-via electrodes in the via-holes;
mounting second chips on the first chips having the through-via electrodes; and
forming a second mold layer on the parent substrate including the first chips and the second chips.

12. The method of claim 11, further comprising:
forming a passivation layer on the exposed first chips and the planarized first mold layer before forming the via-holes,
wherein the forming via-holes successively penetrates the passivation layer and the first chips.

13. The method of claim 12, wherein
the passivation layer includes a first sub-passivation layer and a second sub-passivation layer which are sequentially stacked;
the first sub-passivation layer includes at least one CVD insulating layer; and
the second sub-passivation layer includes a polymer insulating layer.

14. The method of claim 11, further comprising:
bonding the parent substrate to a carrier substrate before mounting the first chips on each of the package board parts.

15. A method of manufacturing a semiconductor package comprising:
providing first chips on a parent substrate, the first chips electrically coupled to the parent substrate, and each of the first chips including at least one first through-via electrode, a first end of each first through-via electrode electrically coupled to the parent substrate and a second end of each first through-via electrode inside a respective one of the first chips;
providing a first mold layer on the first chips;
planarizing the first mold layer to expose top surfaces of the first chips;
thinning the first chips by etching the exposed top surfaces of the first chips such that the second ends of the first through-via electrodes are exposed;
selectively providing a passivation layer on the etched top surfaces of the first chips such that the second ends of the first through-via electrodes are exposed;
providing second chips on the first chips, each of the second chips electrically coupled to a corresponding one of the first chips;
providing a second mold layer on the second chips; and
singulating the resultant structure to form the semiconductor package.

16. The method of manufacturing a semiconductor package of claim 15, wherein the selectively providing a passivation layer exposes top surfaces of the planarized first mold layer.

17. The method of manufacturing a semiconductor package of claim 15, further comprising:
providing a connection medium on the exposed second ends of the first through-via electrodes after the selectively providing the passivation layer and before the providing the second chips on the first chips.

18. The method of manufacturing a semiconductor package of claim 17, wherein the connection medium includes at least one of an inter-chip pad and a chip bump.

19. The method of manufacturing a semiconductor package of claim 15, wherein each of the second chips includes at least one second through-via electrode, the second through-via electrodes electrically coupled to the first through-via electrodes.

20. The method of manufacturing a semiconductor package of claim 15, wherein the providing a second mold layer on the second chips provides the second mold layer on side surfaces of the second chips, while exposing top surfaces of the second chips.

21. The method of manufacturing a semiconductor package of claim 15, further comprising:
attaching a carrier substrate to the parent substrate.

* * * * *